(12) United States Patent
Komori et al.

(10) Patent No.: US 8,884,355 B2
(45) Date of Patent: Nov. 11, 2014

(54) NONVOLATILE SEMICONDUCTOR MEMORY DEVICE AND METHOD FOR MANUFACTURING SAME

(75) Inventors: Yosuke Komori, Mie-ken (JP); Hideaki Aochi, Kanagawa-ken (JP); Ryota Katsumata, Mie-ken (JP); Masaru Kito, Kanagawa-ken (JP); Yoshiaki Fukuzumi, Kanagawa-ken (JP); Masaru Kidoh, Tokyo (JP); Hiroyasu Tanaka, Mie-ken (JP); Megumi Ishiduki, Mie-ken (JP); Tomoko Fujiwara, Kanagawa-ken (JP); Ryouhei Kirisawa, Kanagawa-ken (JP); Yoshimasa Mikajiri, Kanagawa-ken (JP); Shigeto Oota, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 822 days.

(21) Appl. No.: 12/727,712

(22) Filed: Mar. 19, 2010

(65) Prior Publication Data

US 2011/0031550 A1 Feb. 10, 2011

(30) Foreign Application Priority Data

Aug. 4, 2009 (JP) ................................. 2009-181298

(51) Int. Cl.
*H01L 29/72* (2006.01)
*H01L 29/792* (2006.01)
*H01L 27/115* (2006.01)
*H01L 29/66* (2006.01)

(52) U.S. Cl.
CPC ........ *H01L 29/792* (2013.01); *H01L 27/11578* (2013.01); *H01L 29/66833* (2013.01); *H01L 29/7926* (2013.01); *H01L 27/11582* (2013.01); *H01L 27/11573* (2013.01)
USPC .................... 257/324; 257/316; 257/E29.636

(58) Field of Classification Search
USPC ......... 257/296, 306, 679, 388, 412, 413, 755, 257/E29.156, E29.161, E21.165, E21.262, 257/E29.636, E29.078, E29.3, E21.636, 257/314–326, E21.635
See application file for complete search history.

(56) References Cited

U.S. PATENT DOCUMENTS 6,566,707 B1 * 5/2003 Sudo et al. ..................... 257/316
6,570,213 B1 * 5/2003 Wu ................................ 257/315
(Continued)

FOREIGN PATENT DOCUMENTS

JP  07-321228 A   8/1995
JP  2007-266143   10/2007
(Continued)

OTHER PUBLICATIONS

U.S. Appl. No. 12/679,991, filed Mar. 25, 2010, Fukuzumi, et al.

(Continued)

*Primary Examiner* — Cuong Q Nguyen
*Assistant Examiner* — Yosef Gebreyesus
(74) *Attorney, Agent, or Firm* — Oblon, Spivak, McClelland, Maier & Neustadt, L.L.P.

(57) ABSTRACT

A nonvolatile semiconductor memory device includes: a stacked structural unit including a plurality of electrode films and a plurality of inter-electrode insulating films alternately stacked in a first direction; a first selection gate electrode stacked on the stacked structural unit in the first direction; a first semiconductor pillar piercing the stacked structural unit and the first selection gate electrode in the first direction; a first memory unit provided at an intersection of each of the electrode films and the first semiconductor pillar; and a first selection gate insulating film provided between the first semiconductor pillar and the first selection gate electrode, the first selection gate electrode including a first silicide layer provided on a face of the first selection gate electrode perpendicular to the first direction.

17 Claims, 15 Drawing Sheets

(56) References Cited

U.S. PATENT DOCUMENTS

| | | | |
|---|---|---|---|
| 2001/0028080 A1* | 10/2001 | Himeno et al. | 257/315 |
| 2006/0108631 A1* | 5/2006 | Ding | 257/315 |
| 2007/0252201 A1 | 11/2007 | Kito et al. | |
| 2008/0067575 A1* | 3/2008 | Endo et al. | 257/316 |
| 2008/0157092 A1* | 7/2008 | Arai et al. | 257/67 |
| 2008/0173932 A1* | 7/2008 | Kidoh et al. | 257/324 |
| 2008/0186771 A1* | 8/2008 | Katsumata et al. | 365/185.17 |

FOREIGN PATENT DOCUMENTS

| | | |
|---|---|---|
| JP | 2009-158529 A | 7/2009 |
| WO | WO 2009/075370 A1 | 6/2009 |

OTHER PUBLICATIONS

Japanese Office Action dated Jun. 17, 2013, in corresponding Japanese Patent Application No. 2009-181298 filed on Aug. 4, 2009.

* cited by examiner

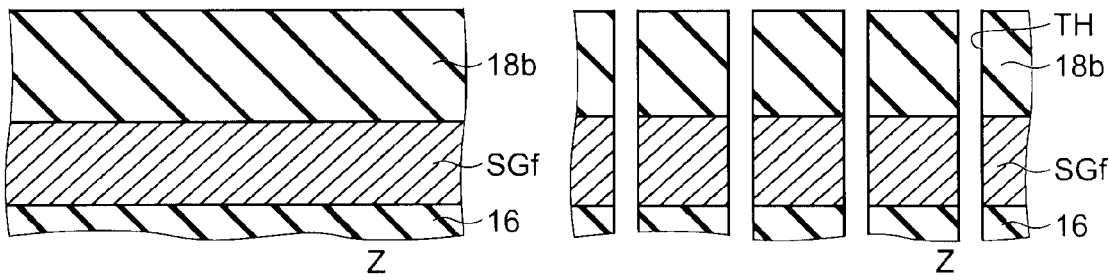
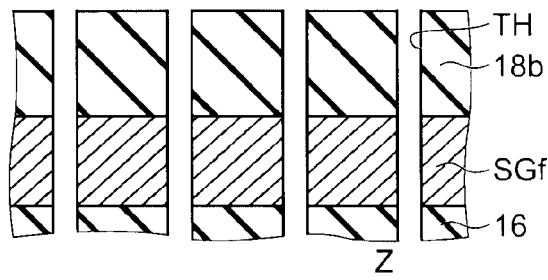
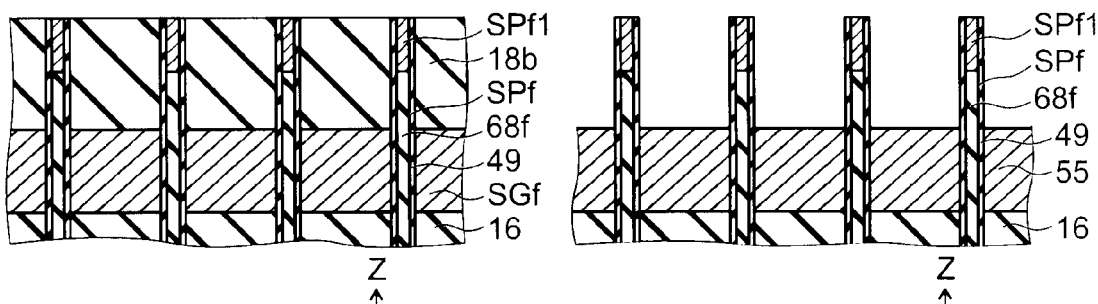
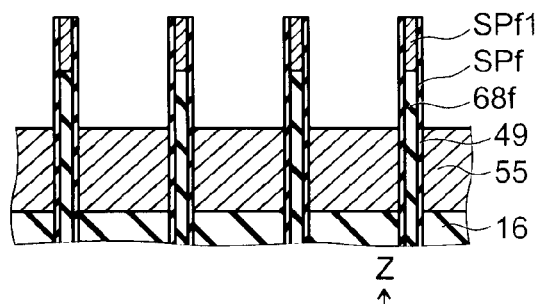
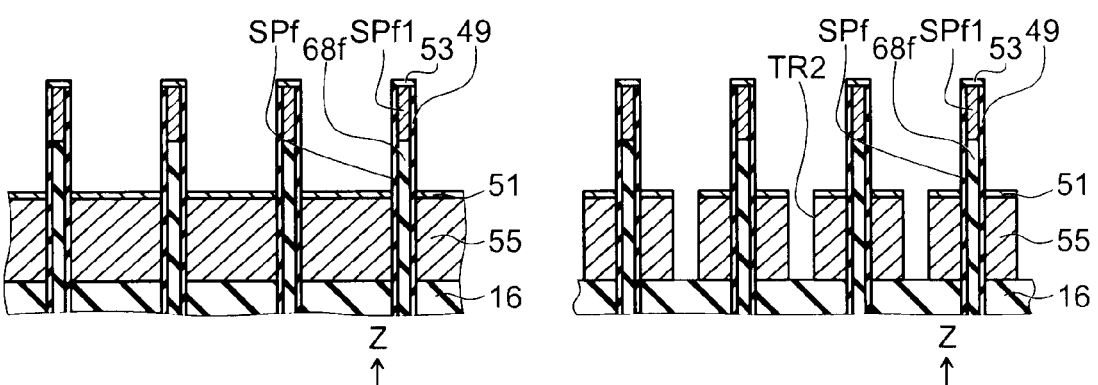
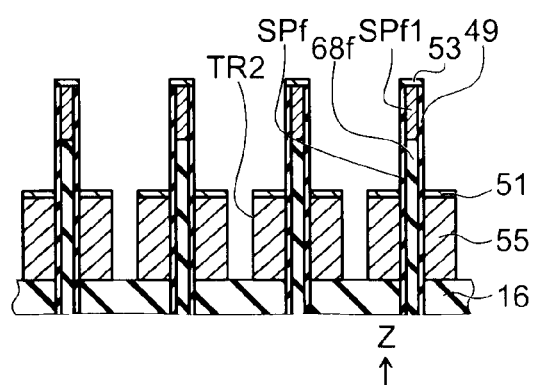
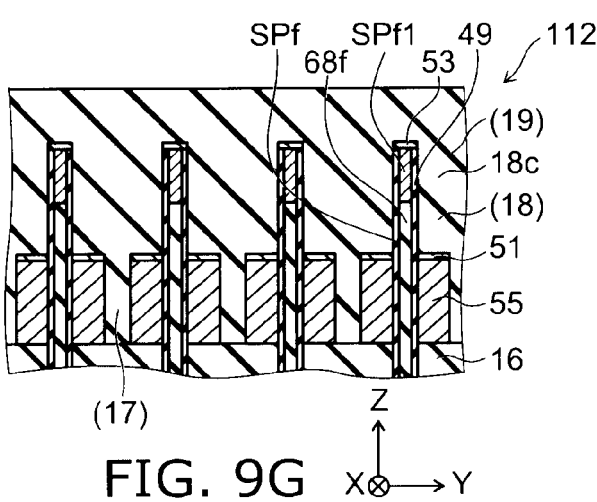

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2009-181298, filed on Aug. 4, 2009; the entire contents of which are incorporated herein by reference.

BACKGROUND

1. Field

Embodiments of the invention relate generally to a nonvolatile semiconductor memory device and a method for manufacturing the same.

2. Description of the Related Art

Collectively patterned three dimensionally stacked memory is presented in order to increase the memory capacity of a nonvolatile semiconductor memory device (memory) (for example, refer to JP-A 2007-266143 (Kokai]). According to such methods, it is possible to suppress cost increases because a stacked memory can be collectively formed regardless of the number of stacks.

In such a collectively patterned three dimensionally stacked memory, a semiconductor pillar that pierces a stacked structural unit in the stacking direction is provided. The stacked structural unit is formed by alternately stacking insulating films with electrode films that form word lines. A charge storage layer (a memory layer) is provided between the semiconductor pillar and the electrode film. Thereby, a memory cell is formed at the intersection of each electrode film and the semiconductor pillar, and a memory string is formed along the semiconductor pillar.

In order to select the semiconductor pillar that forms the memory string, a selection gate electrode is provided parallel to the electrode film, and a selection gate transistor is formed by the selection gate electrode and the semiconductor pillar. Reducing the resistance of the selection gate electrode is desirable in order to improve the response characteristics of the selection gate transistor.

SUMMARY

According to an aspect of the invention, there is provided a nonvolatile semiconductor memory device including: a stacked structural unit including a plurality of electrode films and a plurality of inter-electrode insulating films alternately stacked in a first direction; a first selection gate electrode stacked on the stacked structural unit in the first direction; a first semiconductor pillar piercing the stacked structural unit and the first selection gate electrode in the first direction; a first memory unit provided at an intersection of each of the electrode films and the first semiconductor pillar; and a first selection gate insulating film provided between the first semiconductor pillar and the first selection gate electrode, the first selection gate electrode including a first silicide layer provided on a face of the first selection gate electrode perpendicular to the first direction.

According to another aspect of the invention, there is provided a method for manufacturing a nonvolatile semiconductor memory device, the device including: a stacked structural unit including a plurality of electrode films and a plurality of inter-electrode insulating films alternately stacked in a first direction; a selection gate electrode stacked on the stacked structural unit in the first direction; a semiconductor pillar piercing the stacked structural unit and the selection gate electrode in a first direction; a memory unit provided at an intersection of each of the electrode films and the semiconductor pillar; and a selection gate insulating film provided between the semiconductor pillar and the selection gate electrode and the method including: stacking the stacked structural unit and a selection gate electrode film being to form at least part of the selection gate electrode in the first direction; and silicidizing a face of the selection gate electrode film perpendicular to the first direction.

BRIEF DESCRIPTION OF THE DRAWINGS

FIGS. 9A to 9G are schematic cross-sectional views in order of the processes, illustrating a method for manufacturing another nonvolatile semiconductor memory device according to the first embodiment;

DETAILED DESCRIPTION

Figure 1:
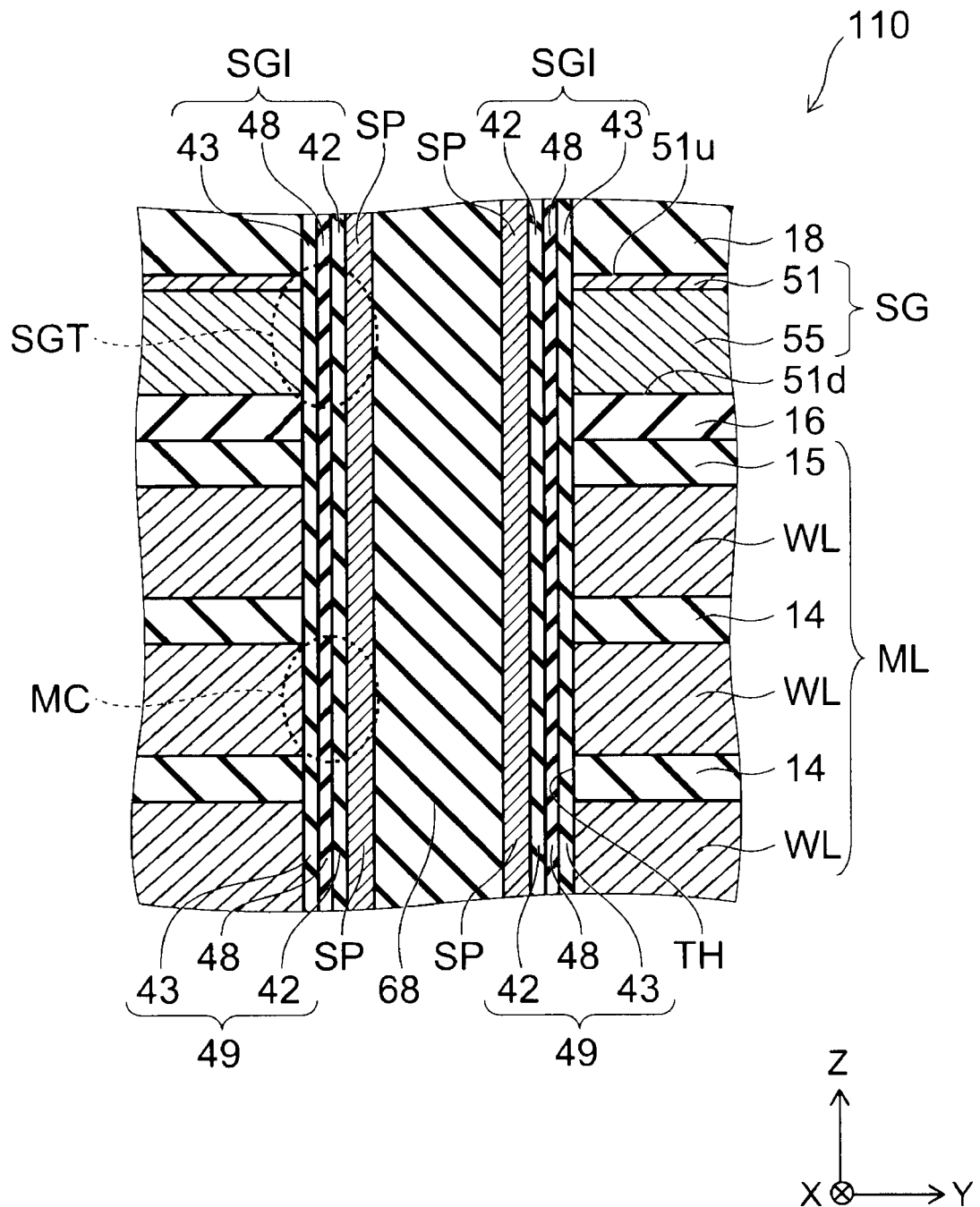
FIG. 1 is a schematic cross-sectional view illustrating the configuration of a nonvolatile semiconductor memory device according to a first embodiment.

Embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification and the drawings of the application, components similar to those described in regard to a drawing thereinabove are marked with like reference numerals, and a detailed description is omitted as appropriate.

First Embodiment

FIG. 1 is a schematic cross-sectional view illustrating the configuration of a nonvolatile semiconductor memory device according to a first embodiment.

Figure 2:
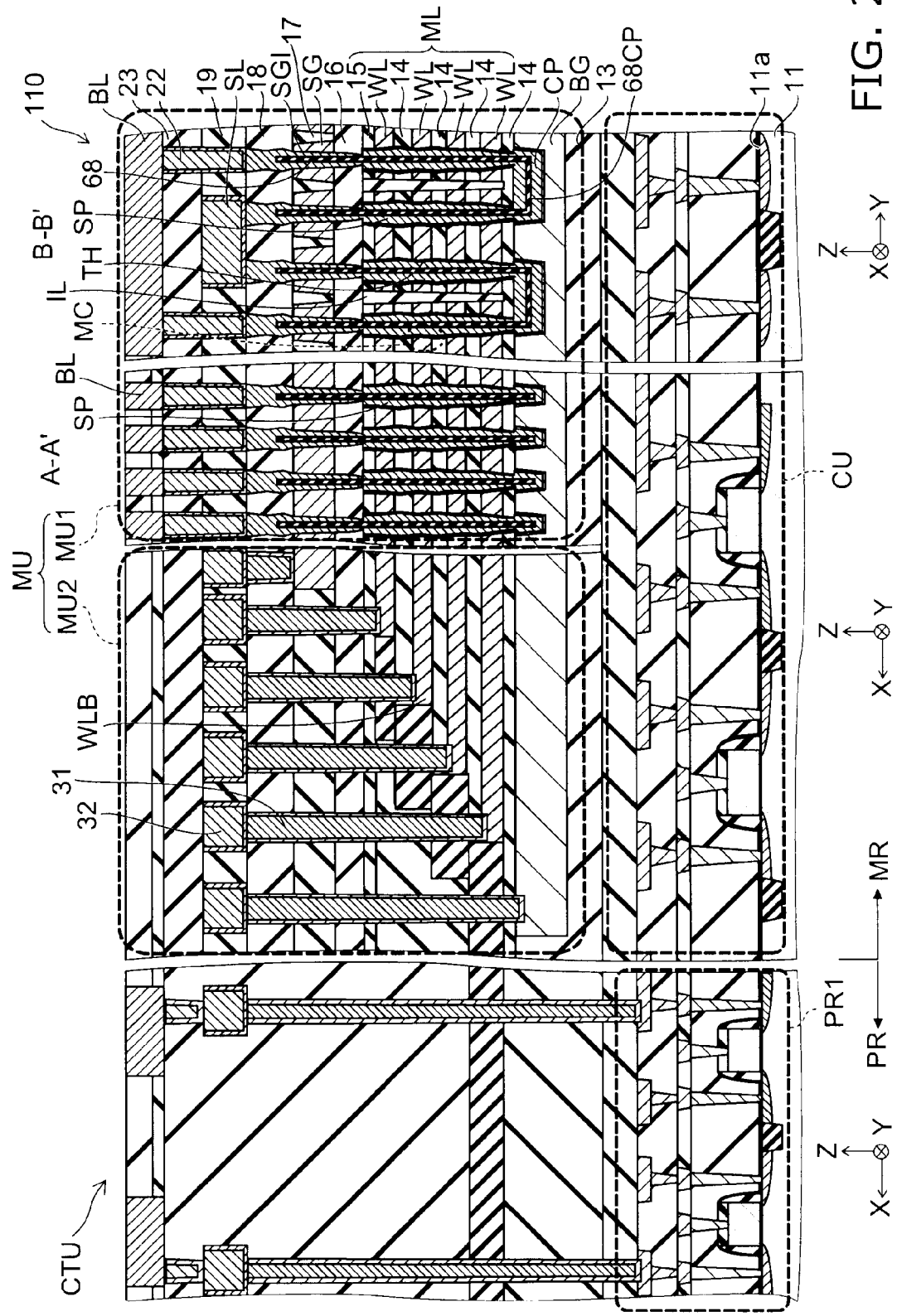
FIG. 2 is a schematic cross-sectional view illustrating the entire configuration of the nonvolatile semiconductor memory device according to the first embodiment.
Figure 3:
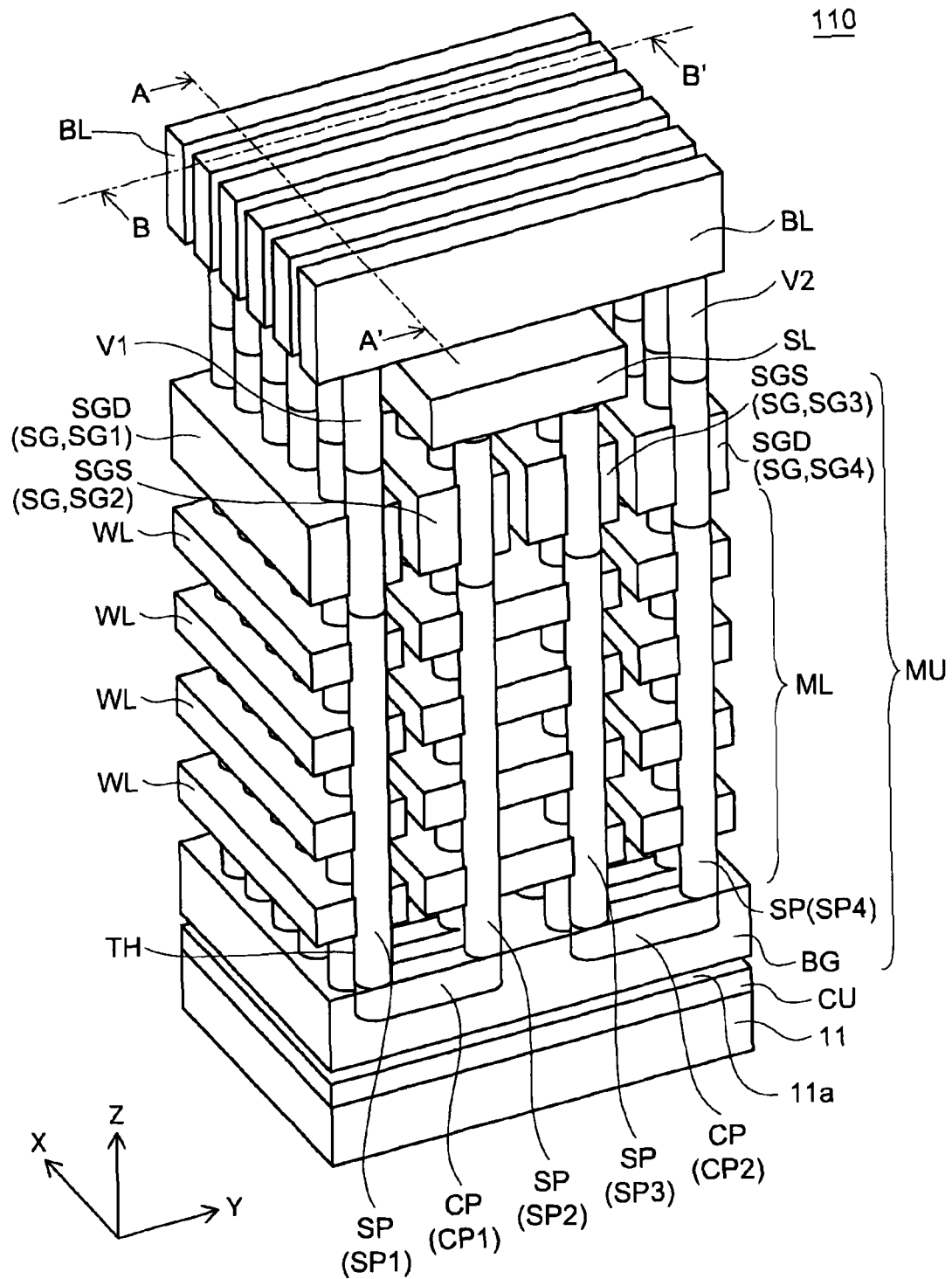
FIG. 3 is a schematic perspective view illustrating the entire configuration of the nonvolatile semiconductor memory device according to the first embodiment.

FIG. 2 and FIG. 3 are a schematic cross-sectional view and a schematic perspective view, respectively, illustrating the entire configuration of the nonvolatile semiconductor memory device according to the first embodiment.

For easier viewing of the drawing, FIG. 3 illustrates only conductive portions, and insulating portions are omitted.

Figure 4:
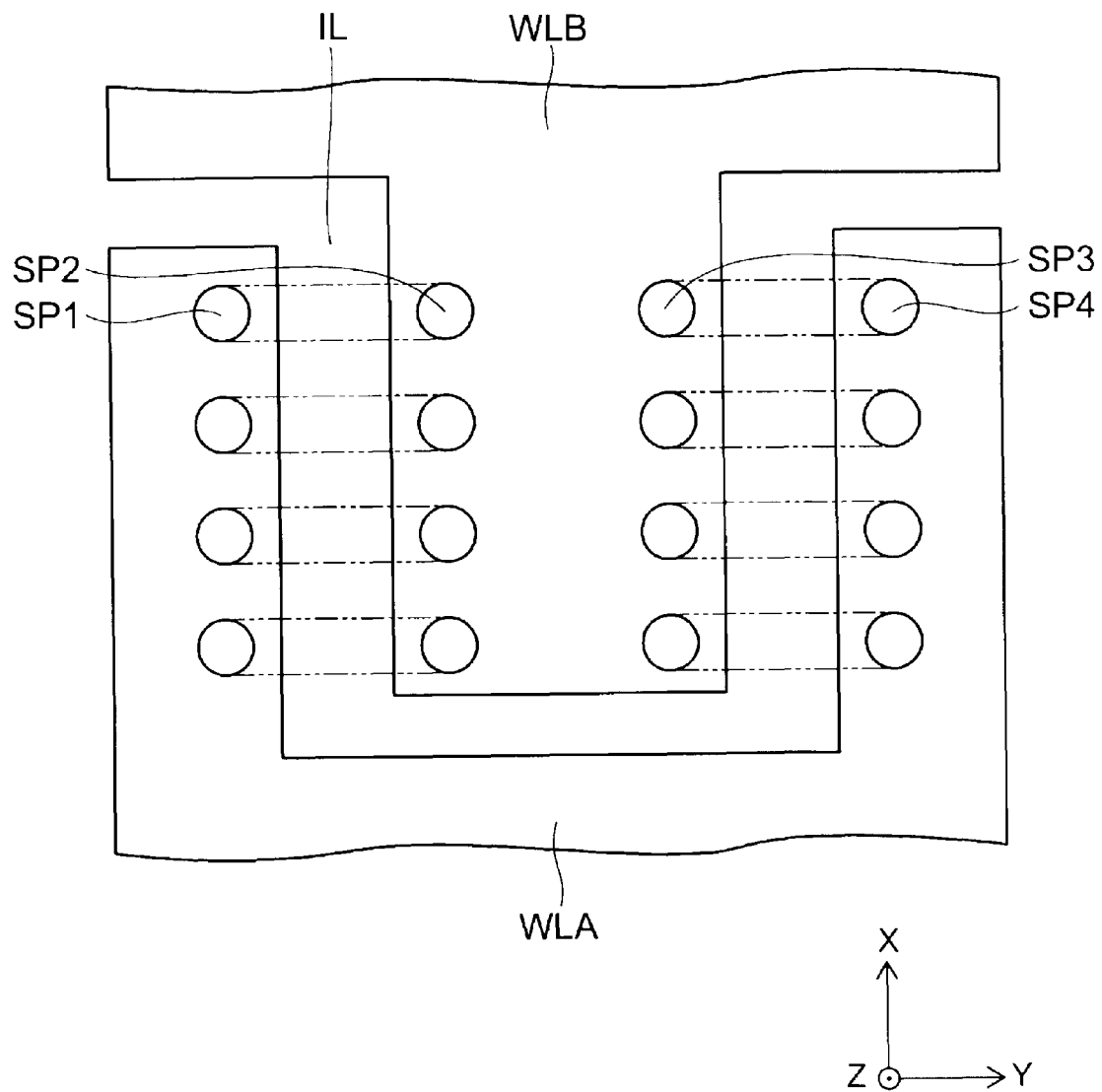
FIG. 4 is a schematic plan view illustrating the configuration of an electrode film of the nonvolatile semiconductor memory device according to the first embodiment.

FIG. 4 is a schematic plan view illustrating the configuration of an electrode film of the nonvolatile semiconductor memory device according to the first embodiment.

A nonvolatile semiconductor memory device 110 according to this embodiment is a collectively patterned three dimensionally stacked flash memory. The nonvolatile semiconductor memory device 110 is a device that includes a U-shaped memory string.

First, the overview of the configuration of the nonvolatile semiconductor memory device 110 is described with reference to FIG. 2 and FIG. 3.

As illustrated in FIG. 2, the nonvolatile semiconductor memory device 110 includes, for example, a memory unit MU and a control unit CTU. The memory unit MU and the control unit CTU are provided on a major surface 11a of a substrate 11 made of, for example, single crystal silicon.

A memory array region MR in which memory cells are provided, and a peripheral region PR provided, for example, around the memory array region MR, for example, are set in the substrate 11. In the peripheral region PR, various peripheral region circuits PR1 are provided on the substrate 11.

In the memory array region MR, a circuit unit CU, for example, is provided on the substrate 11, and a memory unit MU is provided above the circuit unit CU. The circuit unit CU is provided as necessary and may be omitted. An interlayer insulating film 13 made of, for example, silicon oxide is provided between the circuit unit CU and the memory unit MU.

At least part of the control unit CTU, for example, may be provided in, for example, at least one of the peripheral region circuit PR1 and the circuit unit CU mentioned above.

The memory unit MU includes a matrix memory cell unit MU1 including a plurality of memory cell transistors and an interconnect connection unit MU2 connecting the interconnections of the matrix memory cell unit MU1.

FIG. 3 illustrates the configuration of the matrix memory cell unit MU1.

That is, FIG. 2 illustrates portions corresponding to a cross section taken along line A-A' of FIG. 3 and a cross section taken along line B-B' of FIG. 3 as the matrix memory cell unit MU1.

As illustrated in FIG. 2 and FIG. 3, a stacked structural unit ML is provided above the major surface 11a of the substrate 11 in the matrix memory cell unit MU1. The stacked structural unit ML includes a plurality of electrode films WL and a plurality of inter-electrode insulating films 14 that are alternately stacked in the direction perpendicular to the major surface 11a.

Here, a direction perpendicular to the major surface 11a of the substrate 11 is taken as a Z-axis direction (first direction). One direction in a plane parallel to the major surface 11a is taken as a Y-axis direction (second direction). A direction perpendicular to the Z-axis direction and the Y-axis direction is taken as an X-axis direction (third direction).

The stacking direction of the electrode films WL and the inter-electrode insulating films 14 in the stacked structural unit ML is the Z-axis direction. The electrode film WL is divided for each erasing block, for example.

FIG. 1 illustrates the configuration of the matrix memory cell unit MU1 and corresponds to, for example, part of the cross section taken along line B-B' of FIG. 3.

As illustrated in FIG. 1, the memory unit MU of the nonvolatile semiconductor memory device 110 includes: the stacked structural unit ML including the plurality of electrode films WL and the plurality of inter-electrode insulating films 14 alternately stacked in the first direction (the Z-axis direction); a selection gate electrode SG stacked on the stacked structural unit ML in the Z-axis direction; a semiconductor pillar SP piercing the stacked structural unit ML and the selection gate electrode SG in the Z-axis direction (a first semiconductor pillar SP1); a memory unit (a memory cell MC) provided at the intersection of each of the electrode films WL and the semiconductor pillar SP; and a selection gate insulating film SGI (a first selection gate insulating film) provided between the semiconductor pillar SP and the selection gate electrode SG.

In this specific example, the memory unit (the memory cell MC) includes; for example, a memory layer 48 (a first memory layer) provided between each of the electrode films WL and the semiconductor pillar SP (the first semiconductor pillar SP1); an inner-side insulating film 42 (a first inner-side insulating film) provided between the memory layer 48 (the first memory layer) and the semiconductor pillar SP; and an outer-side insulating film 43 (a first outer-side insulating film) provided between each of the electrode films WL and the memory layer 48 (the first memory layer).

In this specific example, the semiconductor pillar SP has a tubular shape aligned in the Z-axis direction, and an insulative core unit 68 is provided in the semiconductor pillar SP.

That is, the outer-side insulating film 43, the memory cell 48, the inner-side insulating film 42, and a film that forms the semiconductor pillar SP are formed in this order on the inner wall face of a through-hole TH piercing the stacked structural unit ML and the selection gate electrode SG in the Z-axis direction, and the insulative core unit 68 is buried in the remaining space.

However, the invention is not limited thereto. As described later, it may have a configuration in which the semiconductor pillar SP having a columnar shape is formed inside the outer-side insulating film 43, the memory layer 48, and the inner-side insulating film 42 on the inside of the through-hole TH instead of providing the core unit 68. In the following, the case is described where the core unit 68 is provided.

The memory cells MC including a memory transistor including the memory layer 48 are provided at the intersections of the electrode films WL of the stacked structural unit ML and the semiconductor pillars SP in a three dimensional matrix configuration, and each memory cell transistor stores data by storing a charge in the memory layer 48.

The electrode film WL functions as a gate electrode of the memory cell transistor. A prescribed electric signal is applied to the electrode film WL, and the electrode film WL forms a word line of the nonvolatile semiconductor memory device 110.

The inner-side insulating film 42 functions as a tunneling insulating film in the memory cell transistor. On the other hand, the outer-side insulating film 43 functions as a block insulating film in the memory cell transistor. The inter-electrode insulating film 14 functions as an interlayer insulating film insulating the electrode films WL from each other.

On the other hand, a selection gate transistor SGT for selecting the semiconductor pillar SP is formed at the intersection of the selection gate electrode SG and the semiconductor pillar SP. The selection gate electrode SG, the selection gate insulating film SGI, and the semiconductor pillar SP function as a gate electrode, a gate insulating film, and a channel layer, respectively, of the selection gate transistor SGT.

Any electrically conducting material may be used for the electrode film WL. In this specific example, amorphous silicon or polysilicon provided with an electrical conductivity by introducing an impurity is used. That is, amorphous silicon or polysilicon is preferably used for the electrode film WL in order to facilitate setting the threshold characteristics of the memory cell transistor formed at the intersection with the semiconductor pillar SP at a desired value.

The material and configuration of the selection gate electrode SG are described later.

A silicon oxide film (silicon oxide), for example, may be used for the inter-electrode insulating film 14, the inner-side insulating film 42, the outer-side insulating film 43, and the selection gate insulating film SGI. The inter-electrode insulating film 14, the inner-side insulating film 42, the outer-side insulating film 43, and the selection gate insulating film SGI may be a single layer film or a stacked film.

A silicon nitride film (silicon nitride), for example, may be used for the memory layer 48, and functions as a unit that stores or emits a charge and stores information by an electric field applied between the semiconductor pillar SP and the electrode film WL. The memory layer 48 may be a single layer film or a stacked film.

A silicon nitride film (silicon nitride), for example, may be used for the core unit 68.

As described later, the materials of the inter-electrode insulating film 14, the inner-side insulating film 42, the memory layer 48, the outer-side insulating film 43, the selection gate insulating film SGI, and the core unit 68 are not limited to the materials illustrated above, but any materials may be used.

Although FIG. 2 and FIG. 3 illustrate the case where the stacked structural unit ML has four layers of the electrode films WL, the number of the electrode films WL provided in the stacked structural unit ML is arbitrary. In the following, the case is described where the number of electrode films WL is four.

In this specific example, two semiconductor pillars SP are connected by a connection portion CP. That is, the memory unit MU of the nonvolatile semiconductor memory device 110 further includes a second semiconductor pillar SP2 and a first connection portion CP1 (the connection portion CP). The second semiconductor pillar SP2 is included in the semiconductor pillar SP.

The second semiconductor pillar SP2 is adjacent to the first semiconductor pillar SP1 in the Y-axis direction, for example, and pierces the stacked structural unit ML and the selection gate electrode SG in the Z-axis direction.

The memory layer 48 is provided also between each of the electrode films WL and the second semiconductor pillar SP2. The inner-side insulating film 42 is provided also between the second semiconductor pillar SP2 and the memory layer 48. The outer-side insulating film 43 is provided also between the electrode film WL and the memory layer 48 of the second semiconductor pillar.

The first connection portion CP1 electrically connects the first semiconductor pillar SP1 and the second semiconductor pillar SP2 on the same side in the Z-axis direction (in this example, the substrate 11 side). The first connection portion CP1 is provided to align in the Y-axis direction. The same material as the first and second semiconductor pillars SP1 and SP2 is used for the first connection portion CP1.

That is, a back gate BG (a connection portion conducting layer) is provided above the major surface 11a of the substrate 11 via the interlayer insulating film 13. A trench is provided in a portion of the back gate BG opposed to the first and second semiconductor pillars SP1 and SP2; the outer-side insulating film 43, the memory layer 48, and the inner-side insulating film 42 are formed in the trench; a semiconductor film that forms the connection portion CP is formed thereinside; and a connection portion core unit 68CP is buried in the remaining space. The formation of the outer-side insulating film 43, the memory layer 48, the inner-side insulating film 42, the connection portion CP, and the connection portion core unit 68CP in the trench is performed collectively at the same time as the formation of the outer-side insulating film 43, the memory layer 48, the inner-side insulating film 42, the semiconductor pillar SP, and the core unit 68 in the through-hole TH. Thus, the back gate BG is provided opposite to the connection portion CP.

Thereby, a U-shaped semiconductor pillar is formed by the first and second semiconductor pillars SP1 and SP2 and the connection portion CP to form a U-shaped NAND string.

As illustrated in FIG. 2 and FIG. 3, an end of the first semiconductor pillar SP1 on the side opposite to the first connection portion CP1 is connected to a bit line BL, and an end of the second semiconductor pillar SP2 on the side opposite to the first connection portion CP1 is connected to a source line SL. The semiconductor pillars SP and the bit line BL are connected by a via V1 and a via V2.

In this specific example, the bit line BL aligns in the Y-axis direction and the source line SL aligns in the X-axis direction.

Between the stacked structural unit ML and the bit line BL, a drain-side selection gate electrode SGD (a first selection gate electrode SG1) is provided opposite to the first semiconductor pillar SP1, and a source-side selection gate electrode SGS (a second selection gate electrode SG2) is provided opposite to the second semiconductor pillar SP2. Thereby, desired data can be written on or read out from any memory cell MC of any semiconductor pillar SP. The first selection gate electrode SG1 and the second selection gate electrode SG2 mentioned above are included in the selection gate electrode SG.

In this specific example, the selection gate electrode SG is divided in the Y-axis direction and has a band configuration aligned along the X-axis direction.

As illustrated in FIG. 2, an interlayer insulating film 15 is provided in the uppermost portion (on the side most distant from the substrate 11) of the stacked structural unit ML. An interlayer insulating film 16 is provided on the stacked structural unit ML; the selection gate electrode SG is provided thereon; and an interlayer insulating film 17 is provided between the selection gate electrodes SG. Also a configuration is possible in which the interlayer insulating film 15 is omitted; the uppermost layer of the stacked structural unit ML is the inter-electrode insulating film 14 or the electrode film WL; and the interlayer insulating film 16 is provided on the stacked structural unit ML of the sort. Furthermore, according to circumstances, also a configuration is possible in which the interlayer insulating film 15 and the interlayer insulating film 16 are omitted; the uppermost layer of the stacked structural unit ML is the inter-electrode insulating film 14; and the selection gate electrode SG is provided thereon. Furthermore, also a configuration is possible in which the interlayer insulating film 16 is omitted, and the selection gate electrode SG is provided on the inter-electrode insulating film 14 or the interlayer insulating film 15 of the stacked structural unit ML. In the following, the case is described where the interlayer insulating film 15 and the interlayer insulating film 16 are provided.

An interlayer insulating film 18 is provided on the interlayer insulating film 17, the source line SL and a via 22 (the vias V1 and V2) are provided thereon, and an interlayer insulating film 19 is provided around the source line SL. An interlayer insulating film 23 is provided on the source line SL, and the bit line BL is provided thereon. The bit line BL has a band configuration along the Y-axis.

Silicon oxide, for example, may be used for the interlayer insulating films 15, 16, 17, 18, 19, and 23.

Here, in regard to the semiconductor pillar provided in plural in the nonvolatile semiconductor memory device 110, "semiconductor pillar SP" is used to refer to all of the semiconductor pillars or any semiconductor pillar; and "n-th semiconductor pillar SPn" (n being any integer not less than 1) is used to refer to a designated semiconductor pillar in such cases as describing the relationship between semiconductor pillars.

As illustrated in FIG. 4, in regard to the electrode film WL, the electrode films corresponding to the semiconductor pillars SP(4m+1) and SP(4m+4) are commonly connected to form an electrode film WLA, where m is an integer not less than 0 and n is (4m+1) and (4m+4); and the electrode films corresponding to the semiconductor pillars SP(4m+2) and SP(4m+3) are commonly connected to form an electrode film WLB, where n is (4m+2) and (4m+3). In other words, the electrode film WL has a form in which the electrode film WLA and the electrode film WLB are combined with each other in a comb teeth configuration opposing in the X-axis direction.

As illustrated in FIG. 4, the electrode film WL is divided by an insulating layer IL into a first region (the electrode film WLA) and a second region (the electrode film WLB).

As illustrated in the interconnect connection portion MU2 illustrated in FIG. 2, the electrode film WLB is connected to a word line 32 by a via plug 31 at one end in the X-axis direction to be electrically connected to, for example, a driving circuit provided in the substrate 11. Similarly, the electrode film WLA is connected to a word line by a via plug at the other end in the X-axis direction to be electrically connected to the driving circuit. In other words, the length in the X-axis direction of each of the electrode films WL (the electrode films WLA and the electrode films WLB) stacked in the Z-axis direction changes into a stairstep configuration; and an electrical connection with the driving circuit is performed by the electrode film WLA at one end in the X-axis direction, and an electrical connection with the driving circuit is performed by the electrode film WLB at the other end in the X-axis direction.

As illustrated in FIG. 3, the memory unit MU may further include a third semiconductor pillar SP3, a fourth semiconductor pillar SP4, and a second connection portion CP2. The third semiconductor pillar SP3 and the fourth semiconductor pillar SP4 are included in the semiconductor pillar SP, and the second connection portion CP2 is included in the connection portion CP.

The third semiconductor pillar SP3 is adjacent to the second semiconductor pillar SP2 on the opposite side of the second semiconductor pillar SP2 from the first semiconductor pillar SP1 in the Y-axis direction and pierces the stacked structural unit ML and the selection gate electrode SG in the Z-axis direction. The fourth semiconductor pillar SP4 is adjacent to the third semiconductor pillar SP3 on the opposite side of the third semiconductor pillar SP3 from the second semiconductor pillar SP2 in the Y-axis direction and pierces the stacked structural unit ML and the selection gate electrode SG in the Z-axis direction.

The second connection portion CP2 electrically connects the third semiconductor pillar SP3 and the fourth semiconductor pillar SP4 on the same side in the Z-axis direction (the same side as the first connection portion CP1). The second connection portion CP2 is provided to align in the Y-axis direction and is opposed to the back gate BG.

The memory layer 48 is provided also between each of the electrode films WL and the third and fourth semiconductor pillars SP3 and SP4, and between the back gate BG and the second connection portion CP2. The inner-side insulating film 42 is provided also between the third and fourth semiconductor pillars SP3 and SP4 and the memory layer 48, and between the memory layer 48 and the second connection portion CP2. The outer-side insulating film 43 is provided also between each of the electrode films WL and the memory layers 48 of the third and fourth semiconductor pillars SP3 and SP4, and between the memory layer 48 of the second connection portion CP2 and the back gate BG.

The source line SL is connected to a third end of the third semiconductor pillar SP3 on the side opposite to the second connection portion CP2. The bit line BL is connected to a fourth end of the fourth semiconductor pillar SP4 on the side opposite to the second connection portion CP2.

The source-side selection gate electrode SGS (a third selection gate electrode SG3) is provided opposite to the third semiconductor pillar SP3, and the drain-side selection gate electrode SGD (a fourth selection gate electrode SG4) is provided opposite to the fourth semiconductor pillar SP4. The selection gate insulating film SGI is provided also between the source-side selection gate electrode SGS and the third semiconductor pillar SP3, and between the drain-side selection gate electrode SGD and the fourth semiconductor pillar SP4. The third selection gate electrode SG3 and the fourth selection gate electrode SG4 mentioned above are included in the selection gate electrode SG.

As illustrated in FIG. 1, in the nonvolatile semiconductor memory device 110 having such a configuration, the selection gate electrode SG includes a first silicide layer 51 provided on a face perpendicular to the Z-axis direction. Here, the face perpendicular to the Z-axis direction may be, for example, at least one of the upper face $51u$ and the lower face $51d$ of the selection gate electrode SG, which are faces perpendicular to the Z-axis direction.

In this specific example, the first silicide layer 51 is provided on the upper face $51u$ side of the selection gate electrode SG. That is, in the nonvolatile semiconductor memory device 110, the substrate 11 is provided; the stacked structural unit ML is provided above the substrate 11; the selection gate electrode SG is provided on the opposite side of the stacked structural unit ML from the substrate 11; and the first silicide layer 51 is provided along a face of the selection gate electrode SG on the side opposite to the stacked structural unit ML. The aforementioned face perpendicular to the Z-axis direction on which the first silicide layer 51 is provided is the upper face (the upper face $51u$) of the selection gate electrode SG.

In this specific example, the selection gate electrode SG further includes a silicon layer 55 stacked on the first silicide layer 51 in the Z-axis direction. That is, the selection gate electrode SG has a stacked structure of the silicon layer 55 and the first silicide layer 51 stacked on the silicon layer 55.

The silicon layer 55 includes, for example, amorphous silicon or polysilicon provided with an electrical conductivity by introducing an impurity.

Thus, by providing the first silicide layer 51 having a lower resistance than the silicon layer 55 on at least one of the upper face 51u and the lower face 51d of the selection gate electrode SG, the resistance of the selection gate electrode SG can be reduced and the response characteristics of the selection gate transistor SGT can be improved.

Furthermore, this specific example uses the silicon layer 55 including amorphous silicon or polysilicon as part of the selection gate electrode SG. Thereby, the threshold characteristics of the selection gate transistor SGT formed at the intersection of the selection gate electrode SG and the semiconductor pillar SP can be set easily at a desired value, and this is advantageous for operations of the nonvolatile semiconductor memory device 110.

However, the invention is not limited thereto. It is sufficient that the selection gate electrode SG includes the first silicide layer 51. For example, the entire selection gate electrode SG may be the first silicide layer 51. In this case also, the selection gate electrode SG is configured to include the first silicide layer 51 provided on a face perpendicular to the Z-axis direction.

A silicide including at least one selected from the group consisting of tungsten, molybdenum, titanium, cobalt, nickel, tantalum, vanadium, and niobium, for example, may be used as the first silicide layer 51 mentioned above.

A method for manufacturing the nonvolatile semiconductor memory device 110 will now be described.

FIGS. 5A to 5H are schematic cross-sectional views in order of the processes, illustrating a method for manufacturing the nonvolatile semiconductor memory device according to the first embodiment.

More specifically, FIGS. 5A to 5H are schematic cross-sectional views in order of the processes, in regard to a method for manufacturing the selection gate electrode SG.

First, for example, after the interlayer insulating film 13 is formed on the substrate 11 made of silicon, a conducting film (for example, amorphous silicon or polysilicon doped with an impurity, or the like) that forms the back gate BG is formed; a trench pattern for forming the connection portions CP is formed on the conducting film by using lithography and RIE (reactive ion etching); and a sacrificial layer made of a silicon nitride film is buried in the trench pattern.

The inter-electrode insulating film 14 and the electrode film WL are alternately deposited thereon desired repeating times, and the interlayer insulating film 15 is deposited thereon to form the stacked structural unit ML.

Figure 5A:
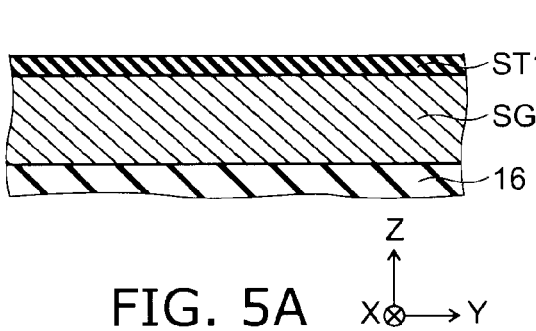
FIGS. 5A to 5H are schematic cross-sectional views in order of the processes, illustrating a method for manufacturing the nonvolatile semiconductor memory device according to the first embodiment.

After that, as illustrated in FIG. 5A, the interlayer insulating film 16 and a selection gate electrode film SGf that forms the selection gate electrode SG are formed on the stacked structural unit ML, and a stopper film ST1 serving as a stopper for CMP (chemical mechanical polishing) processing is formed thereon. An amorphous silicon film doped with an impurity, for example, is used for the selection gate electrode film SGf and a silicon nitride film, for example, is used for the stopper film ST1. As described later, it is sufficient that the selection gate electrode film SGf is a film that forms at least part of the selection gate electrode SG.

Figure 5B:
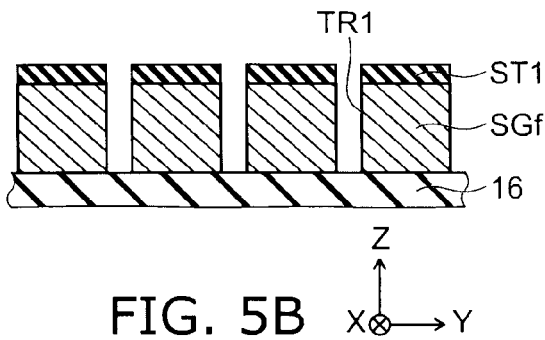

Then, as illustrated in FIG. 5B, the stopper film ST1 and the selection gate electrode film SGf are processed to form the trenches TR1 aligning in the X-axis direction by photolithography and RIE.

Figure 5C:
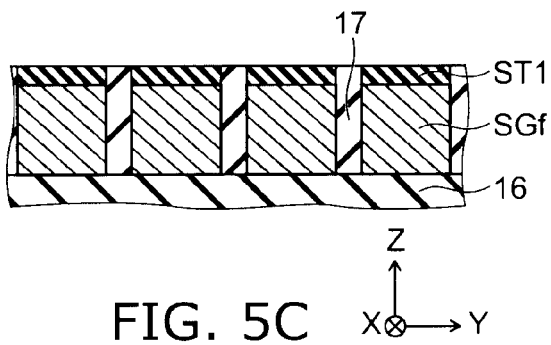

Then, as illustrated in FIG. 5C, an insulating material such as NSG (nondoped silica glass) is buried in the trench TR1, and CMP processing is performed to form the interlayer insulating film 17.

Figure 5D:
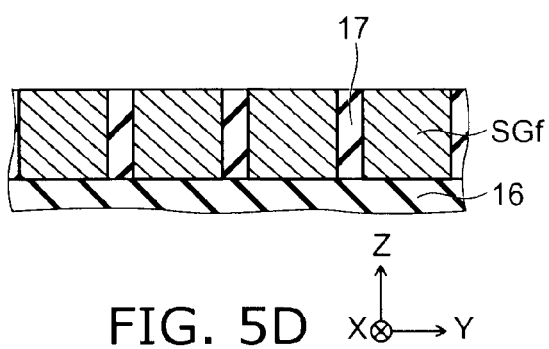

Then, as illustrated in FIG. 5D, the stopper film ST1 is removed by, for example, RIE.

Figure 5E:
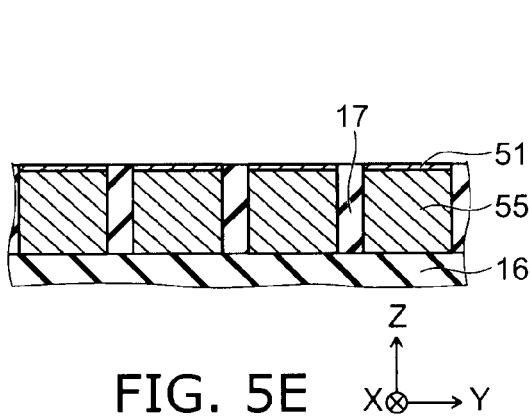

Then, as illustrated in FIG. 5E, a tungsten film, for example, is formed on the exposed selection gate electrode film SGf and the interlayer insulating film 17. Then, heat treatment, for example, is performed to form the first silicide layer 51 made of tungsten silicide on the upper face side of the selection gate electrode film SGf, and portions of the selection gate electrode film SGf other than the first silicide layer 51 form the silicon layer 55. Then, the unnecessary tungsten film is removed to expose the interlayer insulating film 17. Thus, the first silicide layer 51 is formed to the selection gate electrode SG (the selection gate electrode film SGf) in self-aligned manner.

Figure 5F:
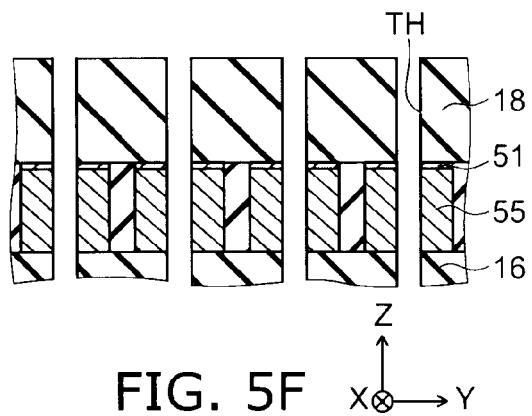

Then, as illustrated in FIG. 5F, the interlayer insulating film 18 is formed on the first silicide layer 51 and the interlayer insulating film 17; the through-hole TH, which pierces the interlayer insulating film 18, the first silicide layer 51, the silicon layer 55, the interlayer insulating film 16, the not-illustrated stacked structural unit ML, and the not-illustrated interlayer insulating film 13 and reaches the sacrificial layer in the aforementioned trench pattern in which the connection portion CP will be formed, is formed; and the sacrificial layer is removed.

Figure 5G:
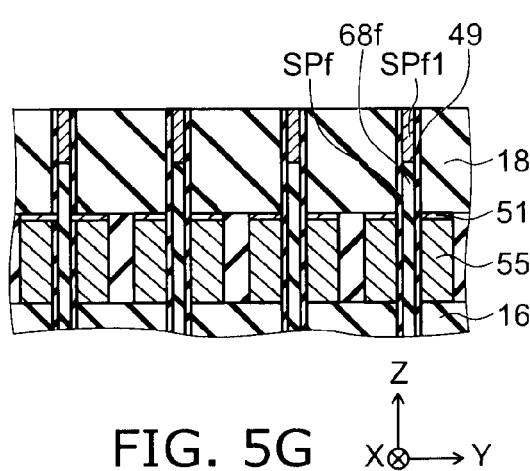

Then, as illustrated in FIG. 5G, a stacked film 49 that forms the outer-side insulating film 43, the memory layer 48, and the inner-side insulating film 42 is formed on the inner wall faces of the through-hole TH and the trench; a semiconductor pillar film SPf that forms the semiconductor pillar SP and the connection portion CP is formed thereinside; and a core unit film 68f that forms the core unit 68 and the connection portion core unit 68CP is buried in the remaining space. Then, etchback is performed by, for example, RIE to remove the core unit film 68f in the upper portion of the through-hole TH, and an amorphous silicon layer SPf1 for contact is buried in the resulting space.

Figure 5H:
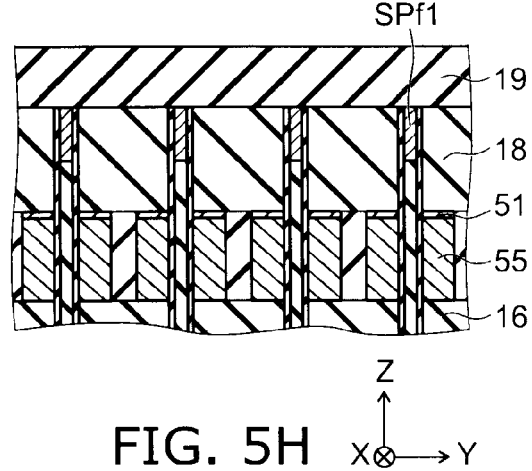

Then, as illustrated in FIG. 5H, the interlayer insulating film 19 is formed on the various films filled in the through-hole TH and the interlayer insulating film 18.

After that, the interlayer insulating film 19 is processed as appropriate to form the source line SL, the via 22, the interlayer insulating film 23, and the bit line BL; thereby, the nonvolatile semiconductor memory device 110 illustrated in FIG. 1 to FIG. 4 can be formed.

In the case of a comparative example in which a silicide layer is provided only on the side face of the selection gate electrode SG, a metal film of tungsten or the like is formed only on the side face of the selection gate electrode film SGf and the silicide layer is formed on the side face thereof. In contrast, in the nonvolatile semiconductor memory device 110 according to this embodiment, the first silicide layer 51 is formed on a face perpendicular to the Z-axis direction, namely, on the upper face 51u side of the selection gate electrode SG in this specific example; and in this case, since a metal film is formed on the upper face of the selection gate electrode film SGf, a metal film can be formed more uniformly than the comparative example that forms the metal film on the side face. Consequently, the first silicide layer 51 can be formed more uniformly, and this embodiment has the advantage of enabling more stable reduction of the resistance of the selection gate electrode SG.

FIGS. 6A to 6F are schematic cross-sectional views in order of the processes, illustrating a method for manufacturing another nonvolatile semiconductor memory device according to the first embodiment.

That is, FIGS. 6A to 6F illustrate a method for manufacturing another nonvolatile semiconductor memory device 110a according to this embodiment. In the nonvolatile semiconductor memory device 110a, a first silicide layer 51a is provided on the lower face 51d (a face on the stacked structural unit ML side) side of the selection gate electrode SG. FIGS. 6A to 6F illustrate a method for manufacturing the portion of the selection gate electrode SG.

First, similarly to the nonvolatile semiconductor memory device 110, for example, the interlayer insulating film 13, a conducting film that forms the back gate BG, the trench pattern of the conducting film, and the sacrificial layer in the trench pattern are formed on the substrate 11 made of silicon, and the stacked structural unit ML is formed thereon.

Figure 6A:
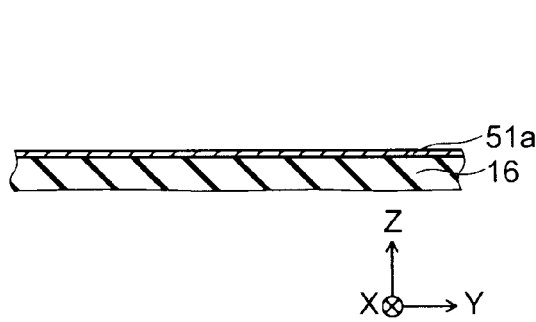
FIGS. 6A to 6F are schematic cross-sectional views in order of the processes, illustrating a method for manufacturing another nonvolatile semiconductor memory device according to the first embodiment.

Then, as illustrated in FIG. 6A, the interlayer insulating film 16 is formed on the stacked structural unit ML, and a thin tungsten film 51af is formed thereon.

Figure 6B:
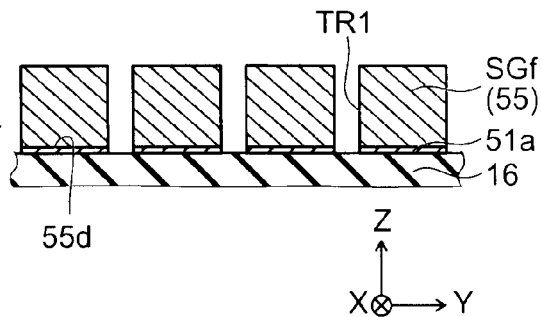

After that, as illustrated in FIG. 6B, the selection gate electrode film SGf made of amorphous silicon is formed on the tungsten film 51af and heat treatment is performed as necessary to form a tungsten silicide layer; and the selection gate electrode film SGf and the tungsten silicide layer are processed by photolithography and RIE to form the trenches TR1 aligning in the X-axis direction. Thereby, the selection gate electrode SG including the first silicide layer 51a made of the tungsten silicide layer and the silicon layer 55 stacked thereon is formed.

Figure 6C:
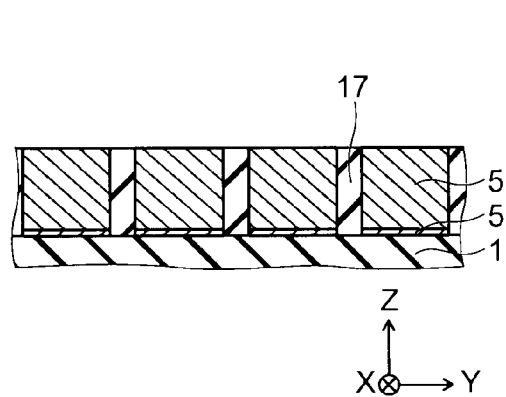

Then, as illustrated in FIG. 6C, an insulating material such as NSG is buried in the trench TR1, and CMP processing is performed to form the interlayer insulating film 17.

Figure 6D:
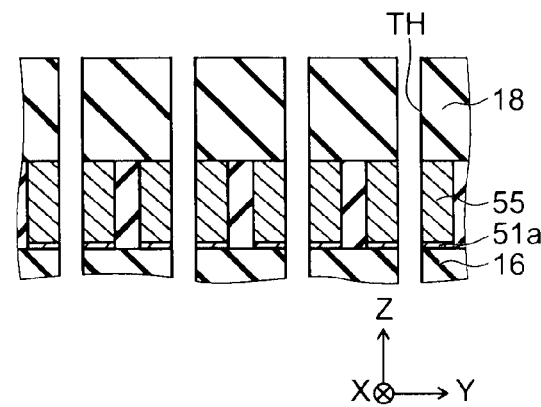

Then, as illustrated in FIG. 6D, after the interlayer insulating film 18 is formed on the silicon layer 55 and the interlayer insulating film 17, the through-hole TH, which pierces the interlayer insulating film 18, the silicon layer 55, the first silicide layer 51a, the interlayer insulating film 16, the not-illustrated stacked structural unit ML, and the not-illustrated interlayer insulating film 13 and reaches the sacrificial layer in the aforementioned trench pattern in which the connection portion CP will be formed, is formed, and the sacrificial layer is removed.

Figure 6E:
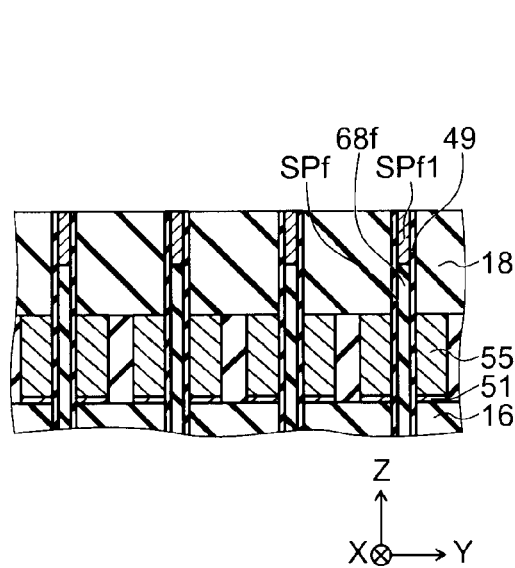

Then, as illustrated in FIG. 6E, the stacked film 49, the semiconductor pillar film SPf, and the core unit film 68f are buried on the inner wall face of the through-hole TH; the upper portion of the core unit film 68f is removed; and the amorphous silicon layer SPf1 is buried thereon.

Figure 6F:
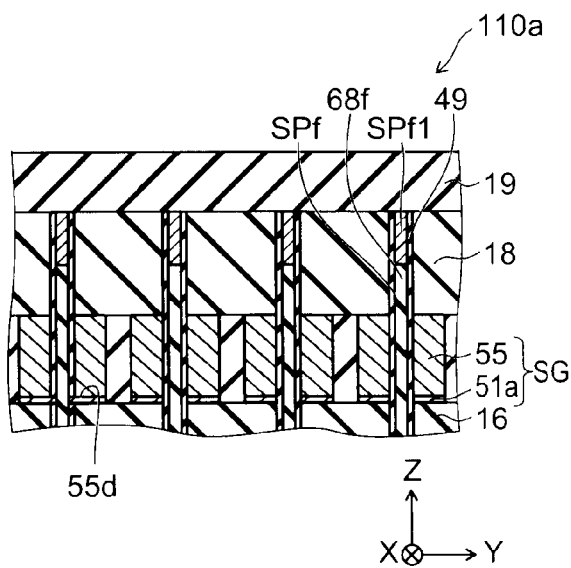

Then, as illustrated in FIG. 6F, the interlayer insulating film 19 is formed on the film buried in the through-hole TH and the interlayer insulating film 18.

After that, the interlayer insulating film 19 is processed as appropriate to form the source line SL, the via 22, the interlayer insulating film 23, and the bit line BL; thereby, the nonvolatile semiconductor memory device 110a can be formed.

Also in the nonvolatile semiconductor memory device 110a, the first silicide layer 51a having a lower resistance than the silicon layer 55 is provided on the lower face 51d of the selection gate electrode SG; thereby, the resistance of the selection gate electrode SG can be reduced and the response characteristics of the selection gate transistor SGT can be improved.

The first silicide layer 51 on the upper face 51u side of the selection gate electrode and the first silicide layer 51a on the lower face 51d side may be formed simultaneously.

The following method also is possible. That is, in the processes illustrated in FIGS. 6A and 6B, a lower-layer selection gate electrode film made of, for example, amorphous silicon, which forms part of the selection gate electrode SG, is formed on the interlayer insulating film 16; the lower-layer selection gate electrode film is processed into the pattern of the selection gate electrodes SG; a tungsten film, for example, is formed thereon; heat treatment, for example, is performed to form the first silicide layer 51a of the pattern of the lower-layer selection gate electrode film; then an upper-layer selection gate electrode film that forms other part of the selection gate electrode SG is formed thereon; and the upper-layer selection gate electrode film is processed to form the silicon layer 55; thereby, the selection gate electrode SG including the first silicide layer 51a provided on the lower face 51d side and the silicon layer 55 stacked thereon is formed.

In this process, thickening the thickness of the lower-layer selection gate electrode film can form a stacked structure that includes a lower-side silicon layer on the lower face side of the lower-layer selection gate electrode film and the first silicide layer on the upper face side, and consequently can also form the selection gate electrode SG having a configuration in which the lower-side silicon layer, the first silicide layer, and the silicon layer are stacked in this order from the interlayer insulating film 16 side. Thus, it is sufficient that the first silicide layer is provided on a face perpendicular to the Z-axis. The first silicide layer may be provided on at least one of the upper face 51u and the lower face 51d of the selection gate electrode SG, or in the middle of the selection gate electrode SG in the thickness direction. Furthermore, a plurality of first silicide layers and a plurality of silicon layers may be stacked in the Z-axis direction.

Figure 7:
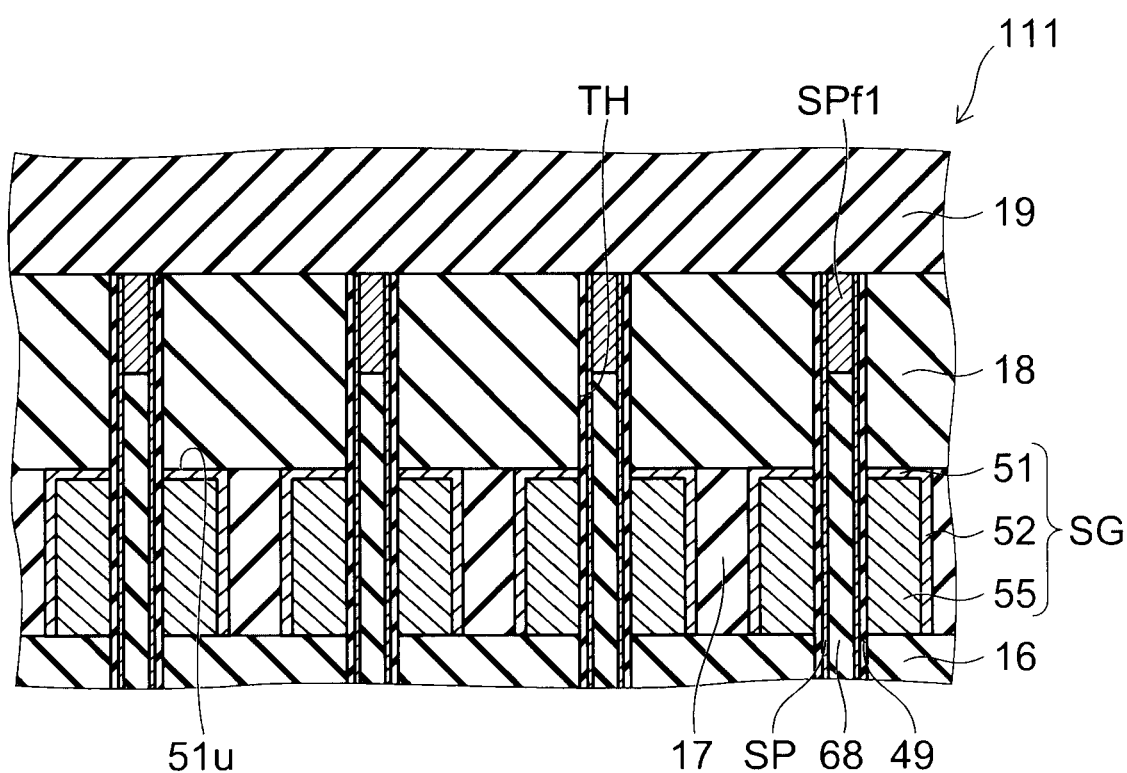
FIG. 7 is a schematic cross-sectional view illustrating the configuration of another nonvolatile semiconductor memory device according to the first embodiment.

FIG. 7 is a schematic cross-sectional view illustrating the configuration of another nonvolatile semiconductor memory device according to the first embodiment.

More specifically, FIG. 7 is a schematic partial cross-sectional view of the portion of the selection gate electrode SG.

As illustrated in FIG. 7, in another nonvolatile semiconductor memory device 111 according to this embodiment, the selection gate electrode SG further includes a second silicide layer 52 provided on the side face thereof. The rest may be similar to the nonvolatile semiconductor memory device 110 and a description is therefore omitted.

The second silicide layer 52 is provided on a face parallel to the Z-axis direction (the first direction).

Thus, the selection gate electrode SG of the nonvolatile semiconductor memory device 111 includes the first silicide layer 51 on the upper face 51u side and further includes the second silicide layer 52 on the side face. Thereby, the resistance of the selection gate electrode SG can be further reduced and the response characteristics of the selection gate transistor SGT can be further improved.

In this case also, using the silicon layer 55 as part of the selection gate electrode SG facilitates setting the threshold characteristics of the selection gate transistor SGT formed at the intersection of the selection gate electrode SG and the semiconductor pillar SP at a desired value, and this is advantageous for operations.

A method for manufacturing the nonvolatile semiconductor memory device 111 will now be described.

FIGS. 8A to 8F are schematic cross-sectional views in order of the processes, illustrating a method for manufacturing another nonvolatile semiconductor memory device according to the first embodiment.

More specifically, FIGS. 8A to 8F are schematic cross-sectional views in order of the processes, in regard to a method for manufacturing the selection gate electrode SG.

First, for example, the interlayer insulating film 13, a conducting film that forms the back gate BG, the trench pattern of the conducting film, and a sacrificial layer in the trench pattern are formed on the substrate 11 made of silicon, and the stacked structural unit ML is formed thereon.

Figure 8A:
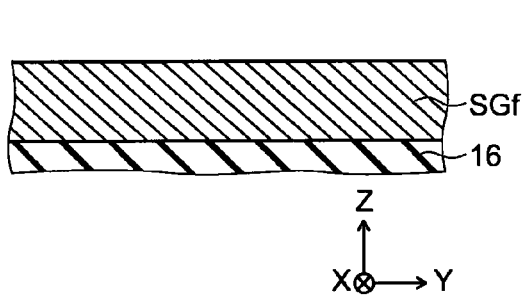
FIGS. 8A to 8F are schematic cross-sectional views in order of the processes, illustrating a method for manufacturing another nonvolatile semiconductor memory device according to the first embodiment.

After that, as illustrated in FIG. 8A, the interlayer insulating film 16 and the selection gate electrode film SGf that forms the selection gate electrode SG are formed on the stacked structural unit ML.

Figure 8B:
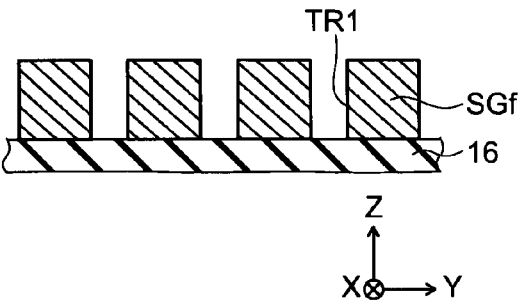

Then, as illustrated in FIG. 8B, the selection gate electrode film SGf is processed by photolithography and RIE to form the trenches TR1 aligning in the X-axis direction.

Figure 8C:
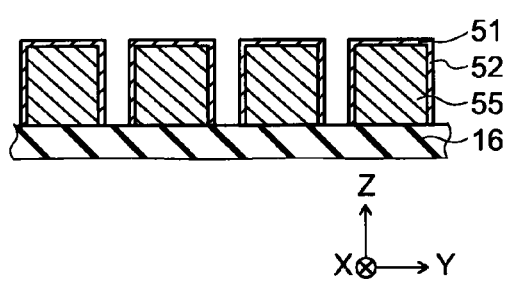

Then, as illustrated in FIG. 8C, a tungsten film, for example, is formed on the upper and side faces of the exposed selection gate electrode film SGf. Then, heat treatment, for example, is performed to form the first silicide layer 51 on the upper face side of the selection gate electrode film SGf and form the second silicide layer 52 on the side face, and portions of the selection gate electrode film SGf other than the first silicide layer 51 and the second silicide layer 52 form the silicon layer 55. The material included in the first silicide layer 51 and the material included in the second silicide layer 52 are substantially identical to each other. Then, the unnecessary tungsten film is removed to expose the interlayer insulating film 16. Thus, the first silicide layer 51 and the second silicide layer 52 are formed to the selection gate electrode SG (the selection gate electrode film SGf) in a self-aligned manner.

Figure 8D:
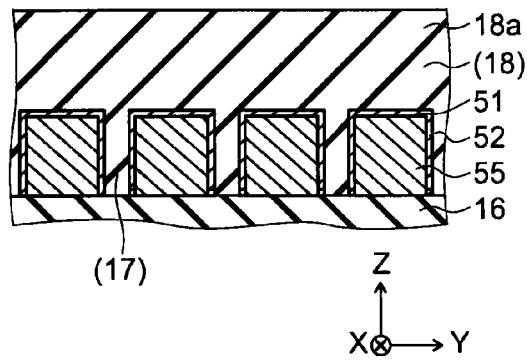

Then, as illustrated in FIG. 8D, an interlayer insulating film 18a of, for example, NSG or the like is formed so as to cover the interlayer insulating film 16, the first silicide layer 51, and the second silicide layer 52 to form the interlayer insulating film 17 and the interlayer insulating film 18.

Figure 8E:
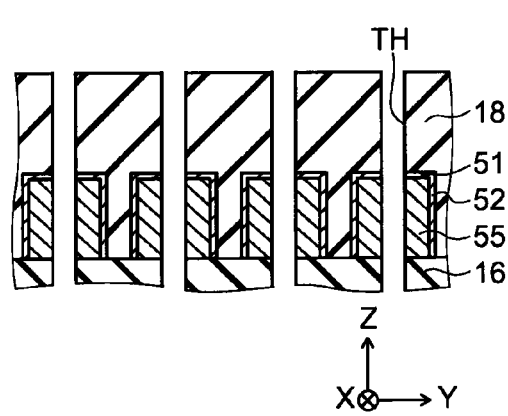

Then, as illustrated in FIG. 8E, the through-hole TH, which pierces the interlayer insulating film 18, the first silicide layer 51, the silicon layer 55, the interlayer insulating film 16, the not-illustrated stacked structural unit ML, and the not-illustrated interlayer insulating film 13 and reaches the sacrificial layer in the aforementioned trench pattern in which the connection portion CP will be formed, is formed, and the sacrificial layer is removed.

Figure 8F:
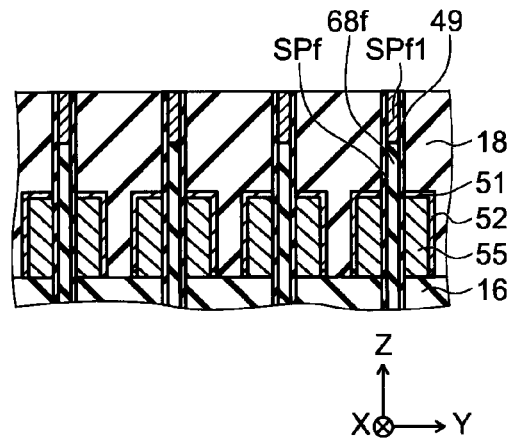

Then, as illustrated in FIG. 8F, the stacked film 49, the semiconductor pillar film SPf, and the core unit film 68f are formed on the inner wall face of the through-hole TH; etch-back is performed by, for example, RIE to remove the upper portion of the core unit film 68f; and the amorphous silicon layer SPf1 for contact is buried in the resulting space.

After that, the interlayer insulating film 19, the source line SL, the via 22, the interlayer insulating film 23, and the bit line BL are formed; thereby, the nonvolatile semiconductor memory device 111 illustrated in FIG. 7 can be formed.

Such a manufacturing method can omit processes and achieve higher productivity as compared with the manufacturing method described in regard to FIGS. 5A to 5H.

Furthermore, in the case of the nonvolatile semiconductor memory device 111, when a metal film is formed on both the upper and side faces of the selection gate electrode film SGf, the metal film is formed uniformly on the upper face; therefore, the requirement of uniformity is moderated for the formation of the metal film on the side face, and the resistance of the selection gate electrode SG can be further reduced stably.

A variation of the method for manufacturing a nonvolatile memory device including the selection gate electrode SG including a silicide layer on the upper face side will now be described.

FIGS. 9A to 9G are schematic cross-sectional views in order of the processes, illustrating a method for manufacturing another nonvolatile semiconductor memory device according to the first embodiment.

More specifically, FIGS. 9A to 9G are schematic cross-sectional views in order of the processes, in regard to a method for manufacturing the selection gate electrode SG.

First, for example, the interlayer insulating film 13, a conducting film that forms the back gate BG, the trench pattern of the conducting film, and a sacrificial layer in the trench pattern are formed on the substrate 11 made of silicon, and the stacked structural unit ML is formed thereon.

After that, as illustrated in FIG. 9A, the interlayer insulating film 16, the selection gate electrode film SGf that forms the selection gate electrode SG, and an interlayer insulating film 18b are formed on the stacked structural unit ML. A silicon oxide film, for example, may be used for the interlayer insulating film 18b.

Then, as illustrated in FIG. 9B, photolithography and RIE are performed to form the through-hole TH that pierces the interlayer insulating film 18b, the selection gate electrode film SGf, the interlayer insulating film 16, the not-illustrated stacked structural unit ML, and the not-illustrated interlayer insulating film 13 and reaches the sacrificial layer in the aforementioned trench pattern in which the connection portion CP will be formed, and the sacrificial layer is removed.

Then, as illustrated in FIG. 9C, the stacked film 49, the semiconductor pillar film SPf, and the core unit film 68f are formed on the inner wall face of the through-hole TH; etch-back is performed by, for example, RIE to remove the upper portion of the core unit film 68f; and the amorphous silicon layer SPf1 for contact is buried in the resulting space.

Then, as illustrated in FIG. 9D, the interlayer insulating film 18b is removed by treatment using, for example, hydrofluoric acid or the like to expose the upper face of the selection gate electrode film SGf.

Then, as illustrated in FIG. 9E, a tungsten film, for example, is formed on the exposed selection gate electrode film SGf and the layer buried in the through-hole TH, and heat treatment, for example, is performed. Thereby, the first silicide layer 51 made of tungsten silicide is formed on the upper face side of the selection gate electrode film SGf, and portions of the selection gate electrode film SGf other than the first silicide layer 51 form the silicon layer 55. A third silicide layer 53 made of tungsten silicide is formed on the upper side of the amorphous silicon layer SPf1 buried in the through-hole TH. In this case also, the first silicide layer 51 is formed to the selection gate electrode SG (the selection gate electrode film SGf) in a self-aligned manner.

Then, as illustrated in FIG. 9F, the first silicide layer 51 and the silicon layer 55 are processed by photolithography and RIE to form the trenches TR2 aligning in the X-axis direction.

Then, as illustrated in FIG. 9G, an interlayer insulating film 18c is formed so as to fill up the trench TR2 and cover the first silicide layer 51, the layer buried in the through-hole TH, and the third silicide layer 53. A silicon oxide film, for example, may be used for the interlayer insulating film 18c. The interlayer insulating film 18c forms the interlayer insulating films 17, 18, and 19 illustrated in FIG. 2.

After that, the source line SL, the via 22, the interlayer insulating film 23, and the bit line BL are formed; thereby, a nonvolatile semiconductor memory device 112 of the variation can be formed.

In this specific example, a silicide layer (the third silicide layer 53) is formed also in the upper portion of the semiconductor pillar SP formed by the through-hole TH, and the third silicide layer 53 is formed collectively with the first silicide layer 51.

A variation of the method for manufacturing a nonvolatile memory device including the selection gate electrode SG including a silicide layer on the upper face 51u and the side face will now be described.

Figure 10A:
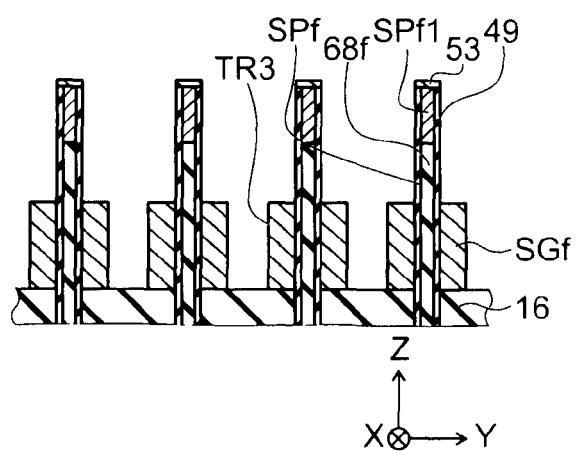
FIGS. 10A to 10C are schematic cross-sectional views in order of the processes, illustrating a method for manufacturing another nonvolatile semiconductor memory device according to the first embodiment.
Figure 10B:
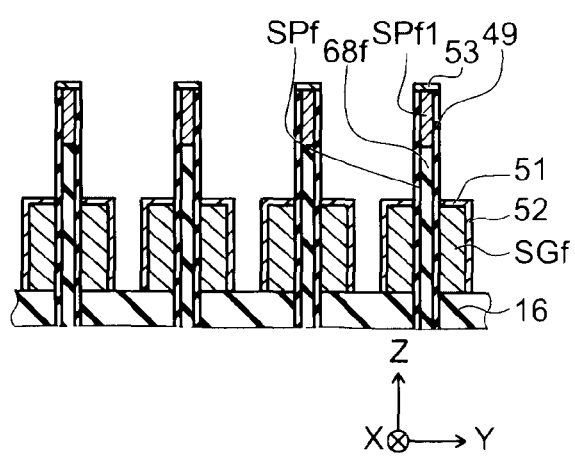
Figure 10C:
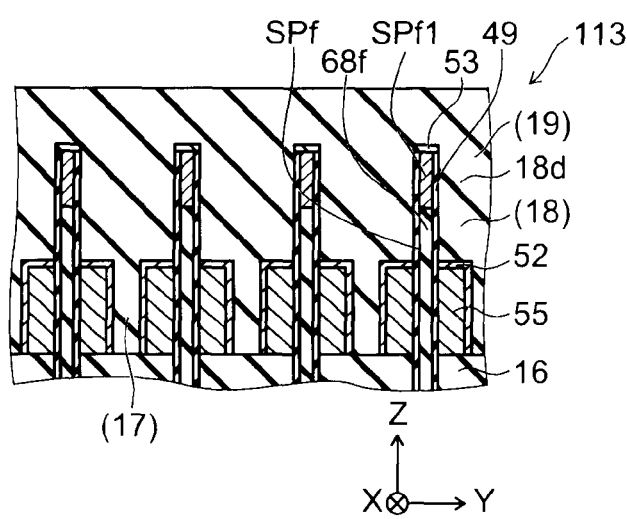

FIGS. 10A to 10C are schematic cross-sectional views in order of the processes, illustrating a method for manufacturing another nonvolatile semiconductor memory device according to the first embodiment.

More specifically, FIGS. 10A to 10C are schematic cross-sectional views in order of the processes, in regard to a method for manufacturing the selection gate electrode SG. This specific example uses the same processes as described in regard to FIGS. 9A to 9D; therefore, processes thereafter are described.

The stacked film 49, the semiconductor pillar film SPf, and the core unit film 68f are formed on the inner wall face of the through-hole TH; the amorphous silicon layer SPf1 is formed in the upper portion thereof; the upper face of the selection gate electrode film SGf is exposed; and then the selection gate electrode film SGf is processed by photolithography and RIE to form trenches TR3 aligning in the X-axis direction, as illustrated in FIG. 10A.

Then, as illustrated in FIG. 10B, a tungsten film, for example, is formed on the exposed upper and side faces of the selection gate electrode film SGf and the layer buried in the through-hole TH, and heat treatment, for example, is performed. Thereby, the first silicide layer 51 and the second silicide layer 52 made of tungsten silicide are formed on the upper face and the side face, respectively, of the selection gate electrode film SGf, and portions of the selection gate electrode film SGf other than the first silicide layer 51 and the second silicide layer 52 form the silicon layer 55. The third silicide layer 53 made of tungsten silicide is formed on the amorphous silicon layer SPf1 buried in the through-hole TH. In this case also, the first silicide layer 51 and the second silicide layer 52 are formed to the selection gate electrode SG (the selection gate electrode film SGf) in a self-aligned manner.

Then, as illustrated in FIG. 10C, an interlayer insulating film 18d is formed so as to fill up the remaining space of the trench TR3 and cover the first silicide layer 51, the second silicide layer 52, the layer buried in the through-hole TH, and the third silicide layer 53. A silicon oxide film, for example, may be used for the interlayer insulating film 18d. The interlayer insulating film 18d forms the interlayer insulating films 17, 18, and 19 illustrated in FIG. 2.

After that, the source line SL, the via 22, the interlayer insulating film 23, and the bit line BL are formed; thereby, a nonvolatile semiconductor memory device 113 of the variation can be formed.

In this specific example, a silicide layer (the third silicide layer 53) is formed also in the upper portion of the semiconductor pillar SP formed by the through-hole TH, and the third silicide layer 53 is formed collectively with the first silicide layer 51 and the second silicide layer 52.

Figure 11:
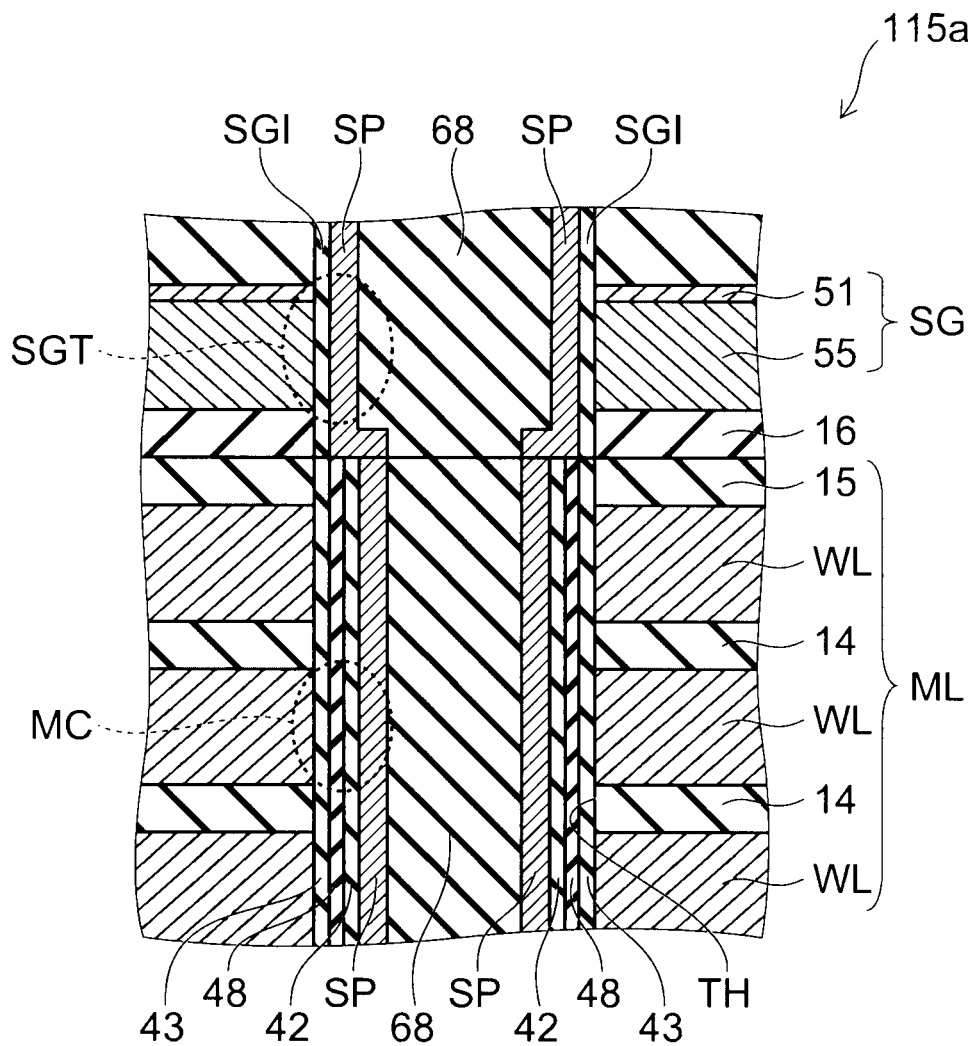
FIG. 11 is a schematic cross-sectional view illustrating the configuration of another nonvolatile semiconductor memory device according to the first embodiment.

FIG. 11 is a schematic cross-sectional view illustrating the configuration of another nonvolatile semiconductor memory device according to the first embodiment.

As illustrated in FIG. 11, in another nonvolatile semiconductor memory device 115a according to this embodiment, the structure between a portion of the semiconductor pillar SP piercing the stacked structural unit ML and the electrode film WL and the structure between a portion of the semiconductor pillar SP piercing the selection gate electrode SG and the selection gate electrode SG are different from each other.

That is, whereas the stacked film 49 of the outer-side insulating film 43, the memory layer 48, and the inner-side insulating film 42 is provided between the portion of the semiconductor pillar SP and the electrode film WL as described above, the selection gate insulating film SGI that is a different insulating film from the stacked film 49 is provided between the semiconductor pillar SP and the selection gate electrode SG. A silicon oxide film may be used for the selection gate insulating film SGI. Thus, the selection gate insulating film SGI may have various modified configurations.

Figure 12A:
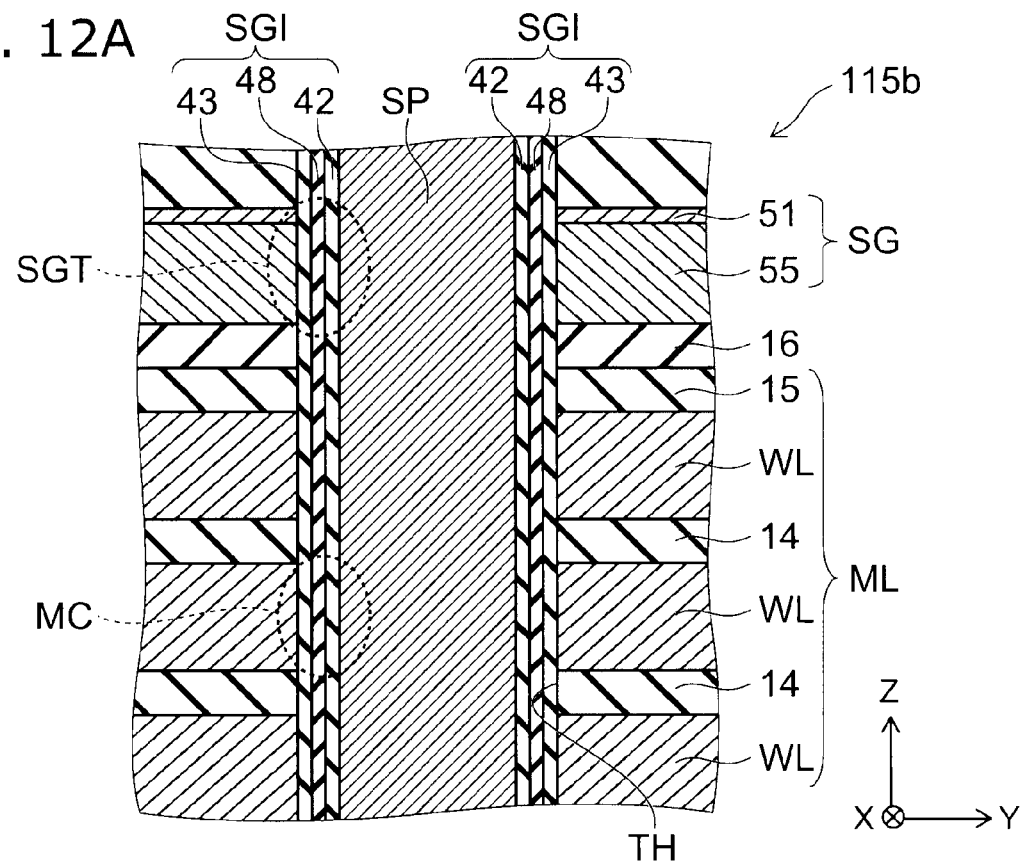
FIGS. 12A and 12B are schematic cross-sectional views illustrating the configurations of other nonvolatile semiconductor memory devices according to the first embodiment.
Figure 12B:
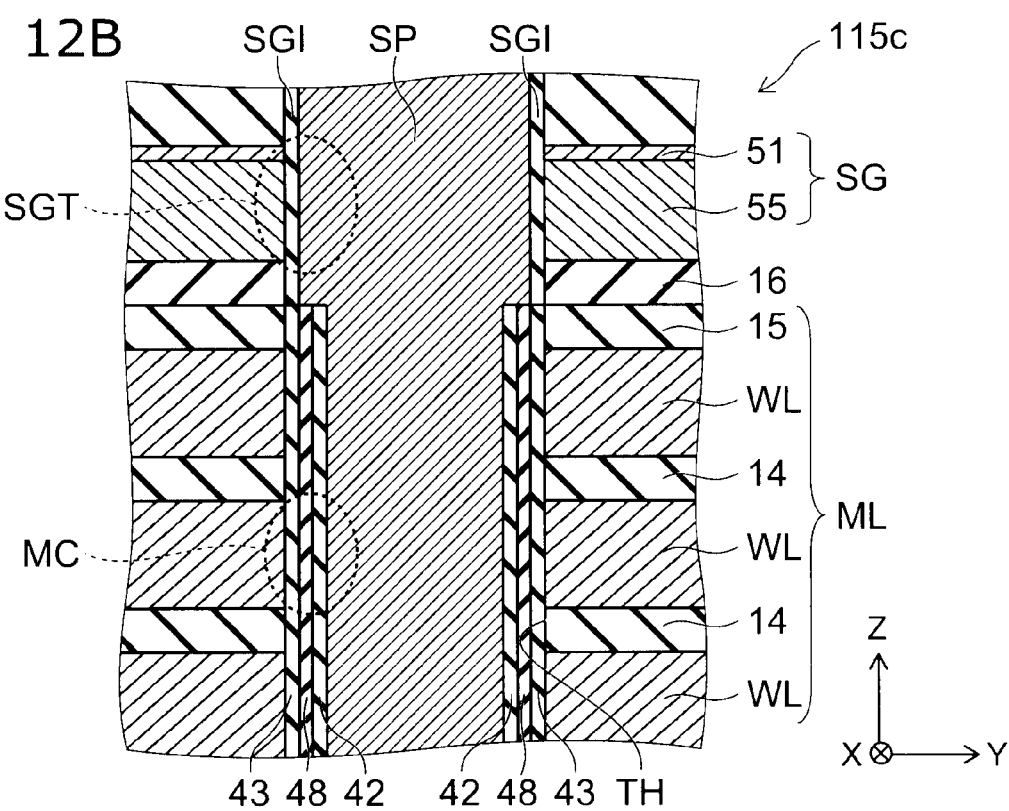

FIGS. 12A and 12B are schematic cross-sectional views illustrating the configurations of other nonvolatile semiconductor memory devices according to the first embodiment.

As illustrated in FIG. 12A, in another nonvolatile semiconductor memory device 115b according to this embodiment, the core unit 68 is not provided and the semiconductor pillar SP has a not tubular but columnar shape as compared to the nonvolatile semiconductor memory device 110. The rest is similar to the nonvolatile semiconductor memory device 110.

Further, as illustrated in FIG. 12B, in another nonvolatile semiconductor memory device 115c according to this embodiment, the core unit 68 is not provided and the semiconductor pillar SP has a not tubular but columnar shape as compared to the nonvolatile semiconductor memory device 115a. The rest is similar to the nonvolatile semiconductor memory device 115a.

Thus, the semiconductor pillar SP may have various modified configurations.

Figure 13:
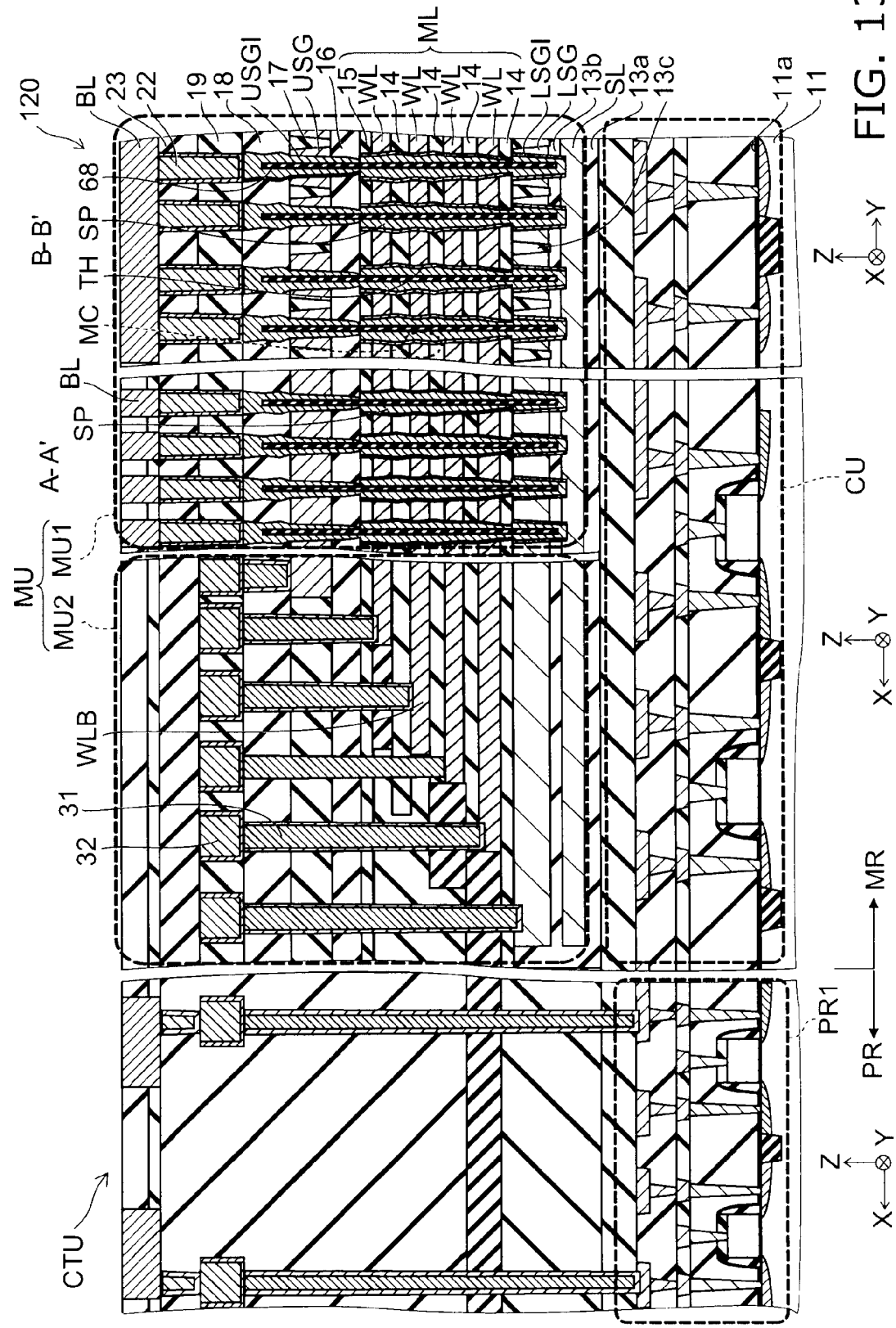
FIG. 13 is a schematic cross-sectional view illustrating the configuration of another nonvolatile semiconductor memory device according to the first embodiment.
Figure 14:
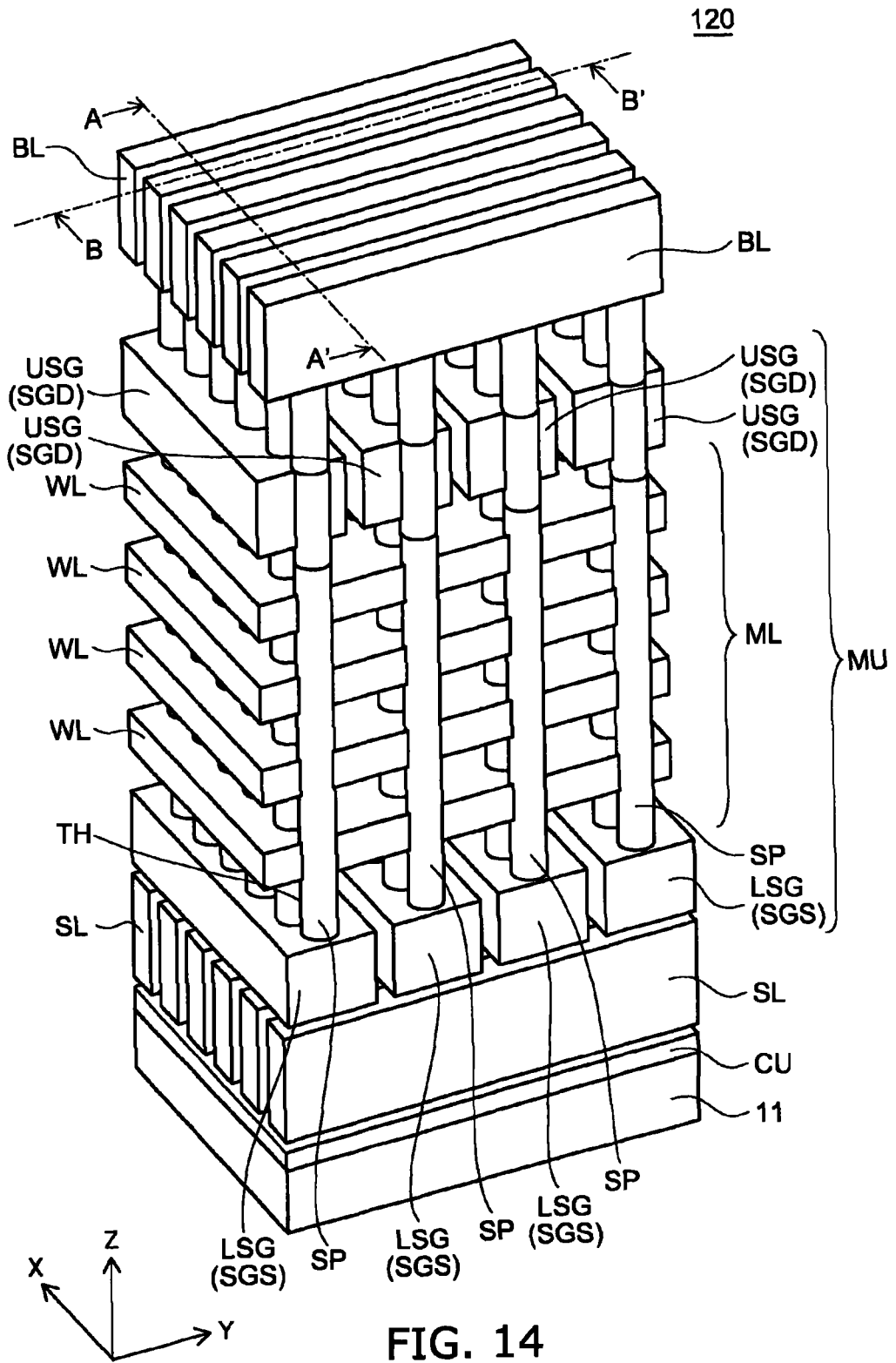
FIG. 14 is a schematic perspective view illustrating the configuration of another nonvolatile semiconductor memory device according to the first embodiment.

FIG. 13 and FIG. 14 are a schematic cross-sectional view and a schematic perspective view, respectively, illustrating the configuration of another nonvolatile semiconductor memory device according to the first embodiment.

For easier viewing of the drawing, FIG. 14 illustrates only conductive portions and insulating portions are omitted.

As illustrated in FIG. 13 and FIG. 14, in a nonvolatile semiconductor memory device 120 according to this embodiment, the semiconductor pillar SP is not connected in a U-shaped configuration but each semiconductor pillar SP is independent. That is, the nonvolatile semiconductor memory device 120 includes a rectilinear NAND string. Further, an upper selection gate electrode USG (forming the drain-side selection gate electrode SGD, for example) is provided on the stacked structural unit ML, and a lower selection gate electrode LSG (forming the source-side selection gate electrode SGS, for example) is provided below the stacked structural unit ML. The upper selection gate electrode USG and the lower selection gate electrode LSG are included in the selection gate electrode SG.

An upper selection gate insulating film USGI made of, for example, silicon oxide is provided between the upper selection gate electrode USG and the semiconductor pillar SP, and a lower selection gate insulating film LSGI made of, for example, silicon oxide is provided between the lower selection gate electrode LSG and the semiconductor pillar SP. The upper selection gate insulating film USGI and the lower selection gate insulating film LSGI are included in the selection gate insulating film SGI.

The source line SL is provided on the lower side of the lower selection gate electrode LSG. An interlayer insulating film 13a is provided below the source line SL, and an interlayer insulating film 13b is provided between the source line SL and the lower selection gate electrode LSG.

The semiconductor pillar SP is connected to the source line SL below the lower selection gate electrode LSG, and the semiconductor pillar SP is connected to the bit line BL above the upper selection gate electrode USG. The memory cells MC are formed in the stacked structural unit ML between the upper selection gate electrode USG and the lower selection gate electrode LSG, and the semiconductor pillar SP functions as one rectilinear NAND string.

The upper selection gate electrode USG and the lower selection gate electrode LSG are divided in the Y-axis direction into band configurations aligned along the X-axis direction.

On the other hand, the bit line BL connected to the upper portion of the semiconductor pillar SP and the source line SL connected to the lower portion of the semiconductor pillar SP have band configurations aligned in the Y-axis direction.

In this case, the electrode film WL is a plate-like conductive film parallel to the X-Y plane.

Also in the nonvolatile semiconductor memory device 120 having such a configuration, at least one of the upper selection gate electrode USG and the lower selection gate electrode LSG includes the first silicide layer 51 provided on a face perpendicular to the Z-axis direction. Here, the face perpendicular to the Z-axis direction may be, for example, at least one of the upper face and the lower face of at least one of the upper selection gate electrode USG and the lower selection gate electrode LSG, which are faces perpendicular to the Z-axis direction.

In this case, at least one of the upper selection gate electrode USG and the lower selection gate electrode LSG in which the first silicide layer 51 is formed further includes the silicon layer 55 stacked on the first silicide layer 51 in the Z-axis direction. That is, at least one of the upper selection gate electrode USG and the lower selection gate electrode LSG has a stacked structure of the silicon layer 55 and the first silicide layer 51 stacked on the silicon layer 55.

The silicon layer 55 includes, for example, amorphous silicon or polysilicon provided with an electrical conductivity also in this case.

Thus, the first silicide layer 51 having a lower resistance than the silicon layer 55 may be used for at least one of the upper face and the lower face of at least one of the upper selection gate electrode USG and the lower selection gate electrode LSG; thereby, the resistance of the selection gate electrode SG can be reduced and the response characteristics of the selection gate transistor SGT can be improved.

In this case also, at least one of the upper selection gate electrode USG and the lower selection gate electrode LSG may further include the second silicide layer 52 provided on a face parallel to the Z-axis direction (the first direction).

Thereby, the resistance of the selection gate electrode SG can be further reduced and the response characteristics of the selection gate transistor SGT can be further improved.

In the case where the first silicide layer 51 is provided on the upper face side of the upper selection gate electrode USG, the upper selection gate electrode USG is provided on the opposite side of the stacked structural unit ML from the substrate 11 and the first silicide layer 51 is provided along a face of the upper selection gate electrode USG on the side opposite to the stacked structural unit ML.

On the other hand, in the case where the first silicide layer 51 is provided on the upper face side of the lower selection gate electrode LSG, the lower selection gate electrode LSG is provided between the substrate 11 and the stacked structural unit ML, and the first silicide layer 51 is provided along a face of the lower selection gate electrode LSG on the stacked structural unit ML side.

Second Embodiment

A method for manufacturing a nonvolatile semiconductor memory device according to a second embodiment of the invention is a method for manufacturing nonvolatile semiconductor memory devices and modified nonvolatile semiconductor memory devices according to the embodiments mentioned above. That is, it is a method for manufacturing a nonvolatile semiconductor memory device including: the stacked structural unit ML including the plurality of electrode films WL and the plurality of inter-electrode insulating films 14 alternately stacked in the first direction (for example, the Z-axis direction); the selection gate electrode SG stacked on the stacked structural unit ML in the first direction; the semiconductor pillar SP piercing the stacked structural unit ML and the selection gate electrode SG in the first direction; the memory unit (the memory cell MC) provided at the intersection of each of the electrode films WL and the semiconductor pillar SP; and the selection gate insulating film SGI provided between the semiconductor pillar SP and the selection gate electrode SG. In the following, a method for forming the selection gate electrode SG, which is a feature of this embodiment, is described.

Figure 15:
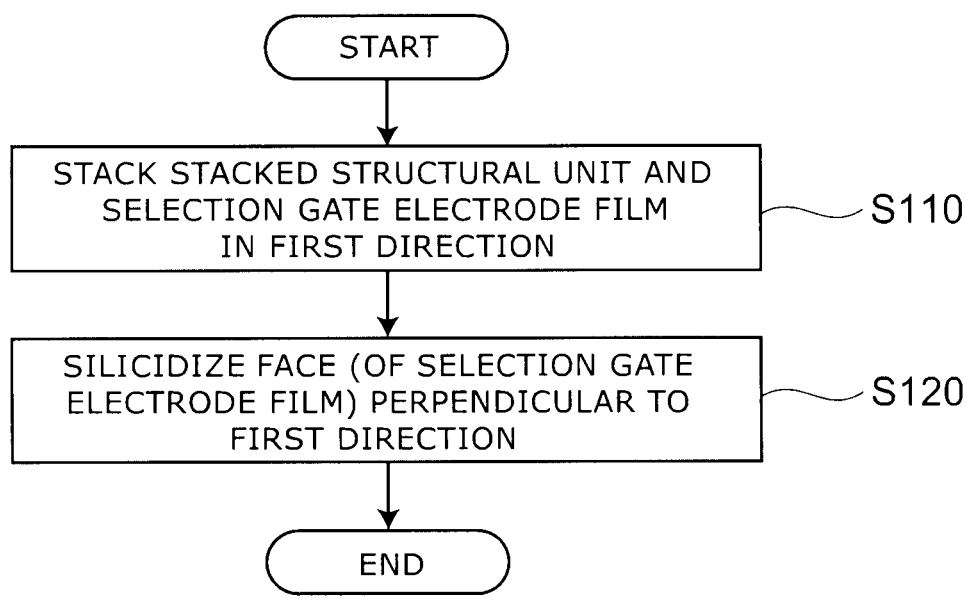
FIG. 15 is a flow chart illustrating a method for manufacturing a nonvolatile semiconductor memory device according to a second embodiment.

FIG. 15 is a flow chart illustrating a method for manufacturing a nonvolatile semiconductor memory device according to the second embodiment.

As illustrated in FIG. 15, in the manufacturing method according to this embodiment, first, the stacked structural unit ML and the selection gate electrode film SGf that forms at least part of the selection gate electrode SG are stacked in the first direction (the Z-axis direction) (step S110). That is, the stacked structural unit ML and the selection gate electrode film SGf are formed, for example, on the major surface 11a of the substrate 11. For example, the process described in regard to FIG. 5A is performed. In the case where, for example, the process illustrated in FIGS. 6A and 6B are performed.

Then, a face of the selection gate electrode film SGf perpendicular to the first direction is silicidized (step S120). For example, the process described in regard to FIG. 5E and FIG. 6A is performed.

Thereby, for example, the first silicide layer 51 having a lower resistance than the silicon layer 55 can be formed on at least one of the upper face 51u and the lower face 51d of the selection gate electrode SG, the resistance of the selection gate electrode SG can be reduced, and the response characteristics of the selection gate transistor SGT can be improved.

In step S120, a face of the selection gate electrode film SGf parallel to the first direction (that is, the side face of the selection gate electrode film SGf) may be further silicidized. That is, the process described in regard to FIG. 8C or FIG. 10B is performed. Thereby, the resistance of the selection gate electrode SG can be further reduced.

In the above, the case of a method that deposits alternately the inter-electrode insulating film 14 and the electrode film WL desired repeating times is described as a method for forming the stacked structural unit ML. However, embodiments of the invention are not limited thereto. For example, a method may be employed that deposits alternately the electrode film WL and the sacrificial film desired repeating times to form a stacked body; forms a supporting column supporting the electrode film WL; removes the sacrificial film; and forms the inter-electrode insulating film 14 in the remaining space formed by removing the sacrificial film. Furthermore, for example, a method may be employed that deposits alternately the inter-electrode insulating film 14 and the sacrificial layer desired repeating times to form a stacked body; forms a supporting column supporting the inter-electrode insulating film 14; removes the sacrificial film; and forms the electrode film WL in the remaining space formed by removing the sacrificial film. The formation of the through-hole TH and the formation of the semiconductor pillar SP may be performed after any process included in the methods mentioned above within the extent of technical feasibility.

In nonvolatile semiconductor memory devices according to embodiments of the invention, the following may be used for the inter-electrode insulating film 14, the inner-side insulating film 42, the outer-side insulating film 43, the selection gate insulating film SGI, and the core unit 68: a single layer film of one selected from the group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a stacked film made of a plurality selected from the group.

The following may be used for the memory layer 48: a single layer film of one selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a stacked film made of a plurality selected from the group.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may appropriately select specific configurations of components of nonvolatile semiconductor memory devices such as substrates, electrode films, insulating films, insulating layers, stacked structural units, memory layers, charge storage layers, semiconductor pillars, word lines, bit lines, source lines, interconnections, memory cell transistors, and selection gate transistors from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all nonvolatile semiconductor memory devices and methods for manufacturing the same practicable by an appropriate design modification by one skilled in the art based on the nonvolatile semiconductor memory devices and the methods for manufacturing the same described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of steps appropriately made by one skilled in the art in regard to the embodiments described above are within the scope of the invention to the extent that the purport of the invention is included.

The invention claimed is:

1. A nonvolatile semiconductor memory device comprising:
   a stacked structural unit including a plurality of electrode films and a plurality of inter-electrode insulating films alternately stacked in a first direction;
   a first selection gate electrode stacked on the stacked structural unit in the first direction;
   a first semiconductor pillar piercing the stacked structural unit and the first selection gate electrode in the first direction;
   a first memory unit provided at an intersection of each of the plurality of electrode films and the first semiconductor pillar; and
   a first selection gate insulating film provided between the first semiconductor pillar and the first selection gate electrode,
   the first selection gate electrode including
   a first silicon layer having a first face perpendicular to the first direction, and
   a first silicide layer provided on the first face, a direction from the first silicide layer toward the first face being parallel to the first direction,
   wherein both of the first silicon layer and the first silicide layer contact the first selection gate insulating film, and
   wherein a distance between the first silicon layer and the first semiconductor pillar is the same as a distance between the first silicide layer and the first semiconductor pillar.

2. The device according to claim 1, wherein the first silicide layer includes a silicide including at least one selected from the group consisting of tungsten, molybdenum, titanium, cobalt, nickel, tantalum, vanadium, and niobium.

3. The device according to claim 1, wherein the first silicon layer includes amorphous silicon including an impurity or polysilicon including an impurity.

4. The device according to claim 1, wherein
   the first silicon layer has a second face intersecting a plane perpendicular to the first direction, and
   the first selection gate electrode further includes a second silicide layer provided on the second face and a direction from the second silicide layer toward the second face is parallel to the plane perpendicular to the first direction.

5. The device according to claim 4, wherein a material included in the first silicide layer and a material included in the second silicide layer are substantially identical to each other.

6. The device according to claim 1, further comprising a substrate,
   the stacked structural unit and the first selection gate electrode being provided above the substrate; and
   the first face perpendicular to the first direction being an upper face of the first selection gate electrode.

7. The device according to claim 1, wherein the first semiconductor pillar includes a third silicide layer provided at an end of the first semiconductor pillar in a direction from the stacked structural unit to the first selection gate electrode.

8. The device according to claim 7, wherein the third silicide layer is formed collectively with the first silicide layer.

9. The device according to claim 1, wherein each of the plurality of electrode films includes at least one of amorphous silicon including an impurity and polysilicon including an impurity.

10. The device according to claim 1, wherein each of the plurality of inter-electrode insulating films and the first selection gate insulating film include silicon oxide.

11. The device according to claim 1, wherein the first memory unit includes:
    a first memory layer provided between each of the plurality of electrode films and the first semiconductor pillar;
    a first inner-side insulating film provided between the first memory layer and the first semiconductor pillar; and a first outer-side insulating film provided between each of the plurality of electrode films and the first memory layer.

12. The device according to claim 11, wherein the first inner-side insulating film and the first outer-side insulating film include silicon oxide.

13. The device according to claim 11, wherein the first memory layer includes a single layer film of one selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate or a stacked film made of a plurality selected from the group.

14. The device according to claim 11, wherein the first memory layer includes silicon nitride.

15. The device according to claim 1, further comprising an insulative core unit, the first semiconductor pillar having a tubular shape aligning in the first direction, and the insulative core unit being disposed inside the first semiconductor pillar.

16. The device according to claim 15, wherein the core unit includes silicon nitride.

17. The device according to claim 1, further comprising:
a second selection gate electrode stacked on the stacked structural unit in the first direction;
a second semiconductor pillar piercing the stacked structural unit and the second selection gate electrode in the first direction;
a second memory unit provided at an intersection of each of the plurality of electrode films and the second semiconductor pillar;
a second selection gate insulating film provided between the second semiconductor pillar and the second selection gate electrode; and
a connection portion connecting the first semiconductor pillar and the second semiconductor pillar on an opposite side of the stacked structural unit from the first selection gate electrode and the second selection gate electrode,
the second selection gate electrode including
a second silicon layer having a third face perpendicular to the first direction, the third silicide layer included in a plane including the first face, and
a third silicide layer provided on the third face, a direction from the third silicide layer toward the third face being perpendicular to the first direction.

* * * * *